(12) United States Patent
Naumov et al.

(10) Patent No.: US 7,593,250 B2
(45) Date of Patent: Sep. 22, 2009

(54) FERROELECTRIC NANOSTRUCTURE HAVING SWITCHABLE MULTI-STABLE VORTEX STATES

(75) Inventors: Ivan I. Naumov, Fayetteville, AR (US); Laurent M. Bellaiche, Fayetteville, AR (US); Sergey A. Prosandeev, Fayetteville, AR (US); Inna V. Ponomareva, Fayetteville, AR (US); Igor A. Kornev, Fayetteville, AR (US)

(73) Assignee: Board of Trustees of the University of Arkansas, Little Rock, AK (US)

( * ) Notice: Subject to any disclaimer, the term of this patent is extended or adjusted under 35 U.S.C. 154(b) by 62 days.

(21) Appl. No.: 11/811,444

(22) Filed: Jun. 8, 2007

(65) Prior Publication Data
US 2008/0130346 A1 Jun. 5, 2008

Related U.S. Application Data

(63) Continuation-in-part of application No. 11/151,088, filed on Jun. 13, 2005.

(60) Provisional application No. 60/632,040, filed on Dec. 1, 2004, provisional application No. 60/580,940, filed on Jun. 18, 2004.

(51) Int. Cl.
*G11C 11/22* (2006.01)
*G11C 13/00* (2006.01)
*G11C 13/04* (2006.01)
*G11C 5/08* (2006.01)

(52) U.S. Cl. .................. 365/145; 365/68; 365/117; 365/121

(58) Field of Classification Search .............. 365/145, 365/68, 117, 121
See application file for complete search history.

(56) References Cited

U.S. PATENT DOCUMENTS

| | | | |
|---|---|---|---|
| 3,868,652 A | 2/1975 | Cooper et al. | |
| 4,071,841 A | 1/1978 | Kumada | |
| 4,101,975 A | 7/1978 | Brody | |
| 4,139,908 A | 2/1979 | Brody | |
| 6,737,694 B2 | 5/2004 | Kim et al. | |
| 2004/0195542 A1 | 10/2004 | Bellaiche et al. | |
| 2006/0083048 A1* | 4/2006 | Naumov et al. ............. 365/145 |

OTHER PUBLICATIONS

Action of U.S. Patent and Trademark Office, U.S. Appl. No. 11/151,088, Jan. 14, 2008.
Fu, H., et al., Ferroelectricity in Barium Titanate Quantum Dots and Rods, Physical Review Letters, vol. 91, No. 25, pp. 257601-1-257601-4, Dec. 18, 2003.
Naumov, I., et al., Unusual Phase Transitions in Ferroelectric Nanodisks and Nanorods, Nature, vol. 432, pp. 737-740, Dec. 9, 2004, available on-line Dec. 3, 2004, released to press Dec. 2, 2004.
Auciello, O., et al., The Physics of Ferroelectric Memories, Physics Today, vol. 51, No. 7, pp. 22-27, Jul. 1998.
Zhong, W., et al., Phase Transitions in $BaTiO_3$ from First Principles, Physical Review Letters, vol. 73, No. 13, pp. 1861-1864, Sep. 26, 1994.
Bellaiche, L., et al., Finite-Temperature Properties of $Pb(Zr_{1-x}Ti_x)O_3$ Alloys form First Principles, Physical Review Letters, vol. 84, No. 23, pp. 5427-5430, Jun. 5, 2000.
Cohen, R., Origin of Ferroelectricity in Perovskite Oxides, Nature, vol. 358, pp. 136-138, Jul. 9, 1992.
Junquera, J., et al., Critical Thickness for Ferroelectricity in Pevokskite Ultrathin Films, Nature, vol. 422, pp. 506-509, Apr. 3, 2003.
George, A., et al., Anomalous Properties in Ferroelectrics Induced by Atomic Ordering, Nature, vol. 413, pp. 54-57, Sep. 6, 2001.
Fu, H., et al., Polarization Rotation Mechanism for Ultrahigh Electromechanical Response in Single-Crystal Piezolectrics, Nature, vol. 403, pp. 281-283, Jan. 20, 2000.
Grinberg, I., et al., Relationship Between Local Structure and Phase Transitions of a Disordered Solid Solution, Nature, vol. 419, pp. 909-911, Oct. 31, 2002.
Mermin, N., et al., Absence of Ferromagnetism or Antiferromagnetism in One- or Two-Dimensional Isotropic Heisenberg Models, Physical Review Letters, vol. 17, No. 22, pp. 1133-1136, Nov. 28, 1966.
Cardy, J., et al., Critical Behavior of Random-Bond Potts Models, Physical Review Letters, vol. 79, No. 21, pp. 4063-4066, Nov. 24, 1997.
Batra, I., et al., New Type of First-Order Phase Transitions in Ferroelectric Thin Films, Physical Review Letters, vol. 30, pp. 384-387, Feb. 26, 1973.
Prosandeev, S., et al., Controlling Toroidal Moment by Means of an Inhomogenous Static Field: An Ab Initio Study, Physical Review Letters, 96, Jun. 16, 2006, pp. 237601-1 to 237601-4.
Bader, S., Colloquium: Opportunities in nanomagnetism, Reviews of Modern Physics, Jan. 3, 2006, pp. 1-15.
Dawber, M., Self-patterning of arrays of ferroelectric capacitors: description by theory of substrate mediated strain interactions, Journal of Physics: Condensed Matter, Oct. 24, 2003, pp. L667-671.
Streiffer, S., et al., Observation of Nanoscale 180° Stripe Domains in Ferroelectric $PbTiO_3$ Thin Films, Physical Review Letters, vol. 89, No. 6, Jul. 19, 2002, pp. 067601-1 to 067601-4.
Ponomareva, I., et al., Atomistic treatment of depolarizing energy and field in ferroelectric nanostructures, Physical Review B, 72, Oct. 24, 2005, pp. 140102-1 to 140102-4.

(Continued)

*Primary Examiner*—Geraldina Visconti
(74) *Attorney, Agent, or Firm*—Ray F. Cox, Jr.

(57) ABSTRACT

A ferroelectric nanostructure formed as a low dimensional nano-scale ferroelectric material having at least one vortex ring of polarization generating an ordered toroid moment switchable between multi-stable states. A stress-free ferroelectric nanodot under open-circuit-like electrical boundary conditions maintains such a vortex structure for their local dipoles when subject to a transverse inhomogeneous static electric field controlling the direction of the macroscopic toroidal moment. Stress is also capable of controlling the vortex's chirality, because of the electromechanical coupling that exists in ferroelectric nanodots.

6 Claims, 8 Drawing Sheets

OTHER PUBLICATIONS

Ponomareva, I., et al., Low-dimensional ferroelectrics under different electrical and mechanical boundary conditions: Atomistic simulations, Physical Review B, 72, Dec. 21, 2005, pp. 214118-1 to 214118-5.

Almamoud, E., et al., Properties of $Pb(Zr,Ti)O_3$ ultrathin films under stress-free and open-circuit electrical boundary conditions, Physical Review B, 70, Dec. 17, 2004, pp. 220102-1 to 220102-4.

Nakamura, K., et al., Curling spin density and orbital structures in a magnetic vortex core of an Fe quantum dot, Physical Review B, 68, Nov. 14, 2003, pp. 180404-1 to 180404-4.

Ginzburg, V., Phase transitions in ferroelectrics: some historical remarks, Physics-Uspekhi, 44 (10), Oct. 2001, pp. 1037-1043.

Schneider, M., et al., Magnetic switching of single vortex permalloy elements, Applied Physics Letters, Vo. 79, No. 19, Nov. 5, 2001, pp. 3113-3115.

Dubovik, V., et al., Reversal of magnetization of aggregates of magnetic particles by a vorticity field and use of toroidness for recording information, Journal of Magnetism and Magnetic Materials, 145, 1995, pp. 211-230.

Schmid, H., On Ferrotoroidics and Electrotoroidic, Magnetotoridic and Piezotoroidic Effects, Proceedings of the International Symposium on Ferroic Domains and Mesoscopic Structures, ISFD-6, Nanjing, China, May 29-Jun. 2, 2000, printed in Ferroelectrics, 252, 41, 2001, 5 pages.

Novosad, V., et al., Effect of interdot magnetostatic interaction on magnetization reversal in circular dot arrays, Physical Review B, 65, Jan. 3, 2002, 060402-1 to 06402-4.

Hubert, A., et al., Magnetic Domains, Springer, New York, 2000, pp. 167-182.

Gorbatsevich, A., et al., Toroidal Order in Crystals, Ferroelectrics, 161, 1994, pp. 321-334.

Dubovik, V., et al., Toroid Momemts in Electrodynamics and Solid-State Physics, Physics Reports, 187, 1990, pp. 145-202.

Prosandeev, S., et al., Properties of Ferroelectric Nanodots Embedded in a Polarizable Medium: Atomistic Simulations, Physical Review Letters, 97, Oct. 20, 2006, pp. 167601-1-167601-4.

Prosandeev, S., et al., Characteristics and Signatures of Dipole Vortices in Ferroelectric Nanodots: First-principles-based Simulations and Analytical Expressions, Physical Review B, 75, Mar. 7, 2007, pp. 094102-1-094102-9.

\* cited by examiner

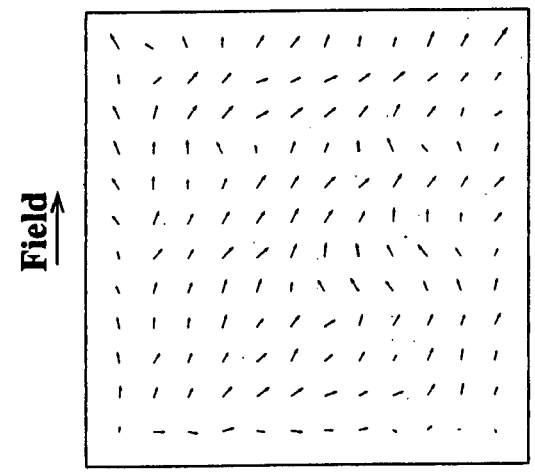
Fig. 1A
Fig. 1B
Fig. 1C
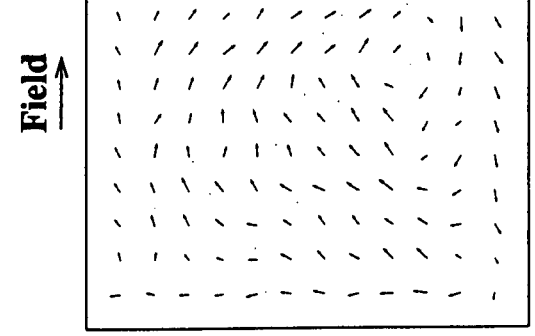
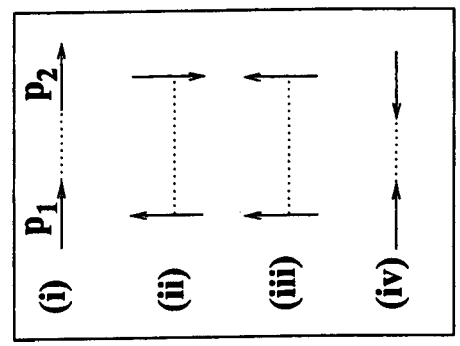
Fig. 1E
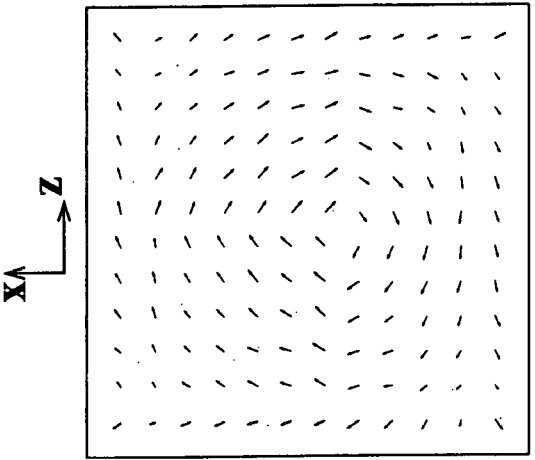
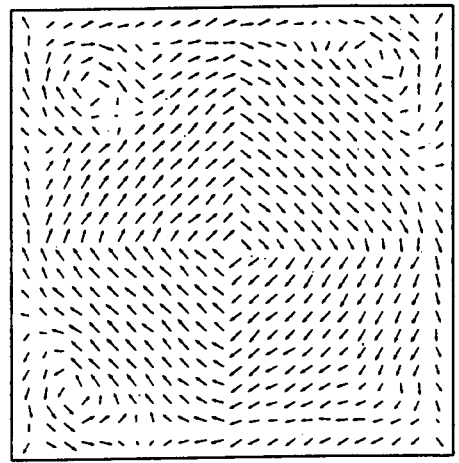
Fig. 1D

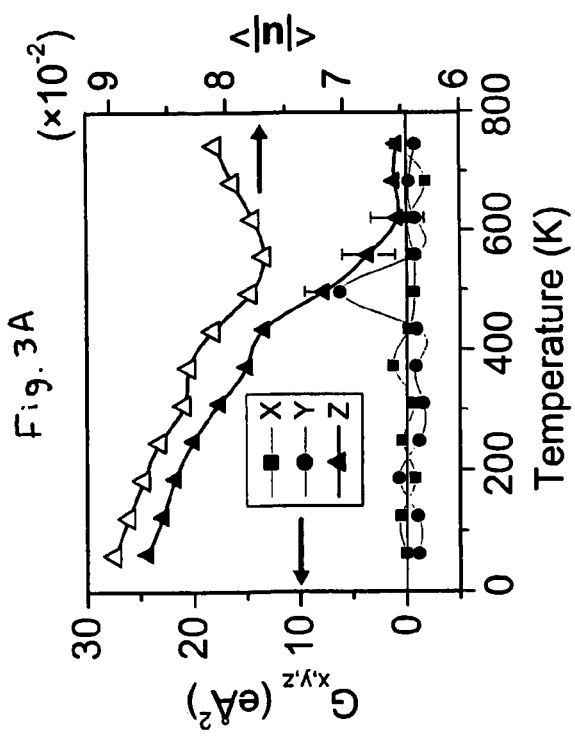
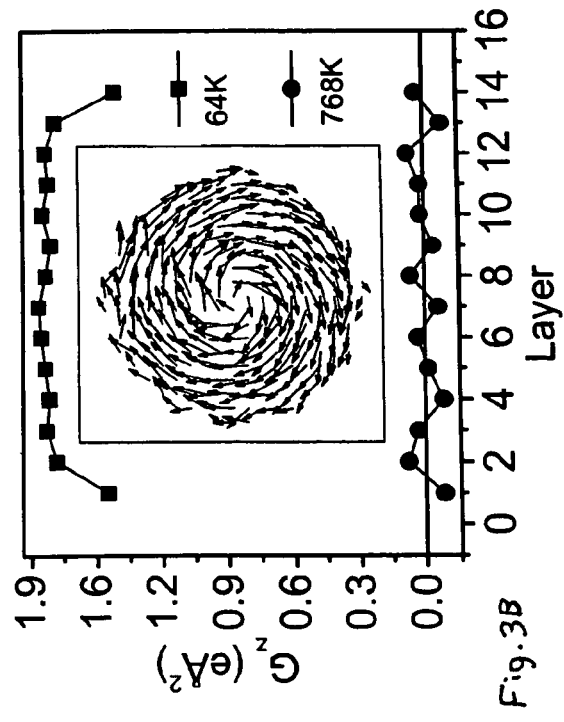
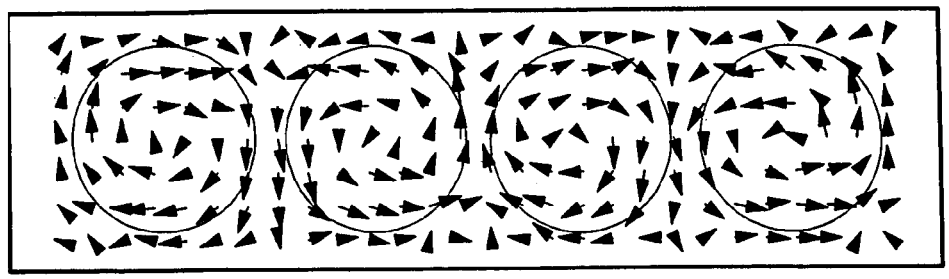
Fig. 3A
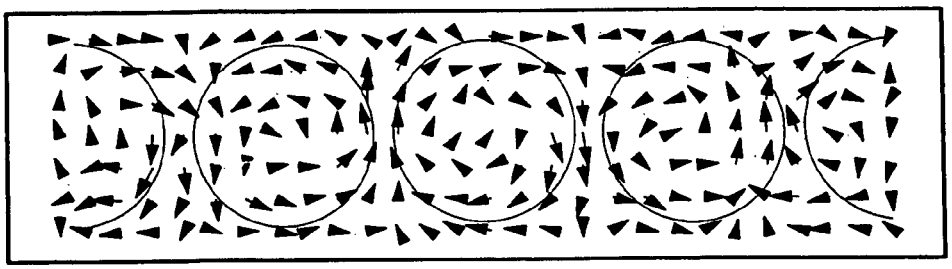
Fig. 3B
Fig. 3C

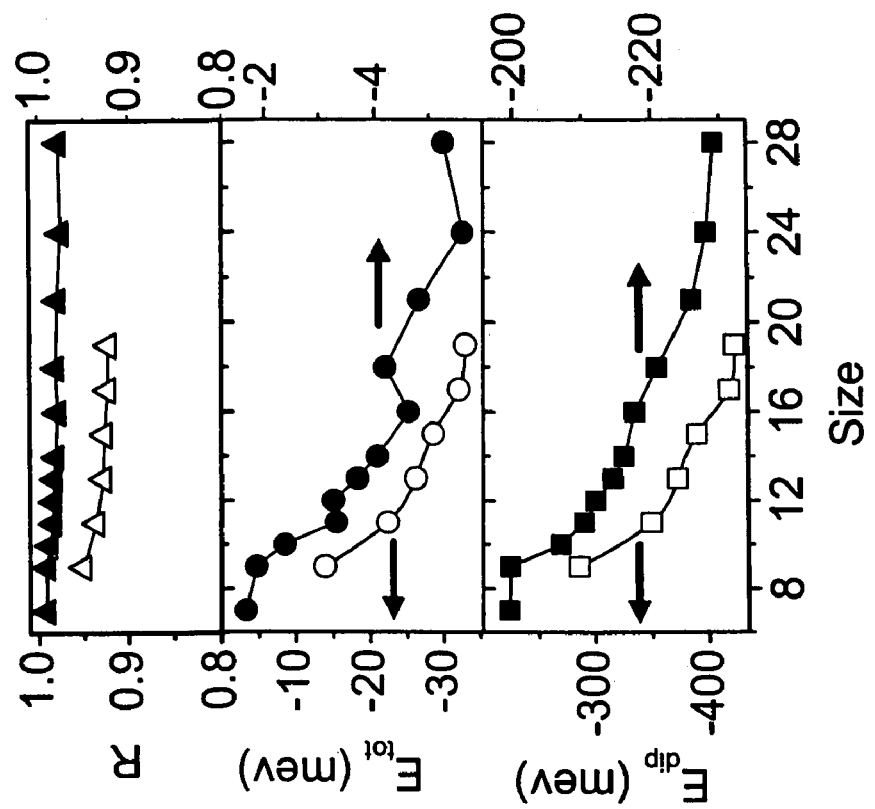
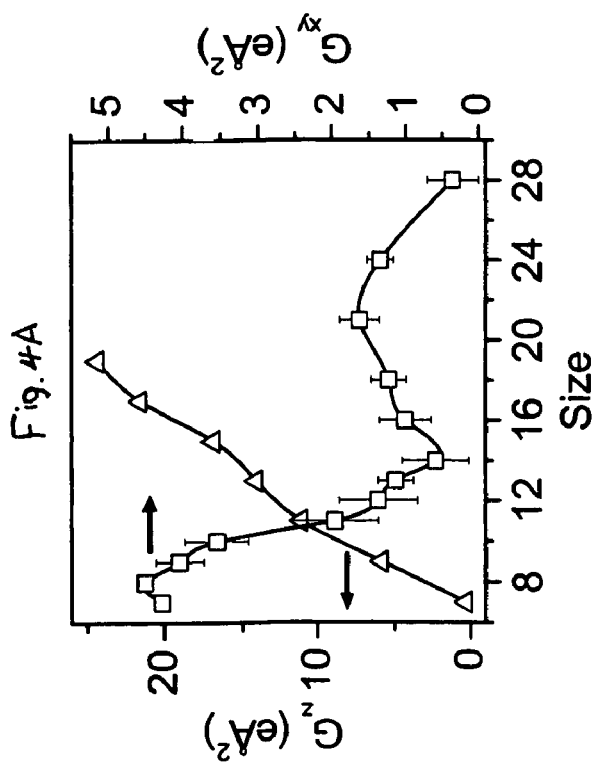
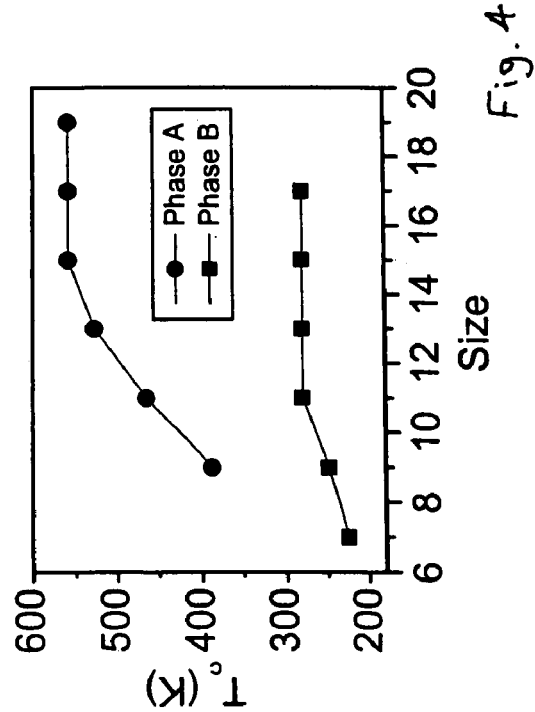
Fig. 4A
Fig. 4B
Fig. 4C

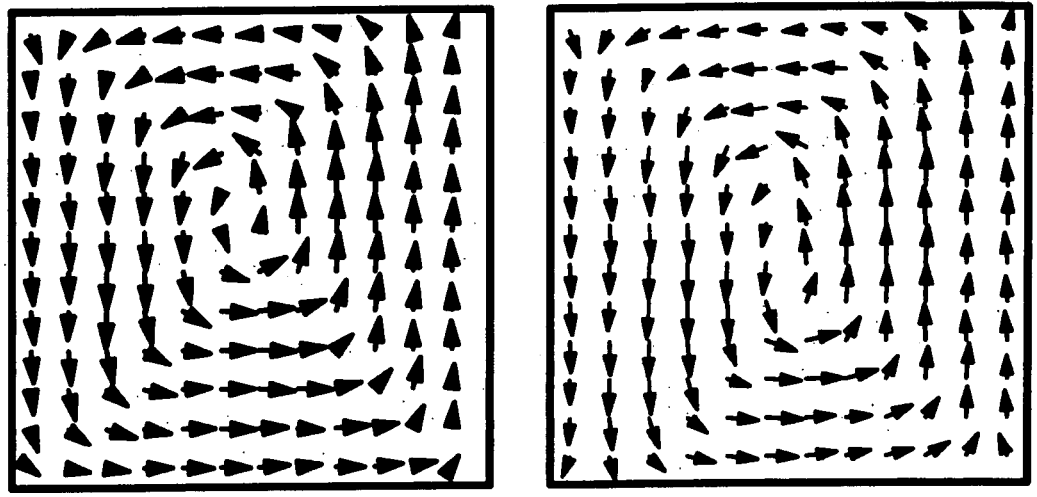
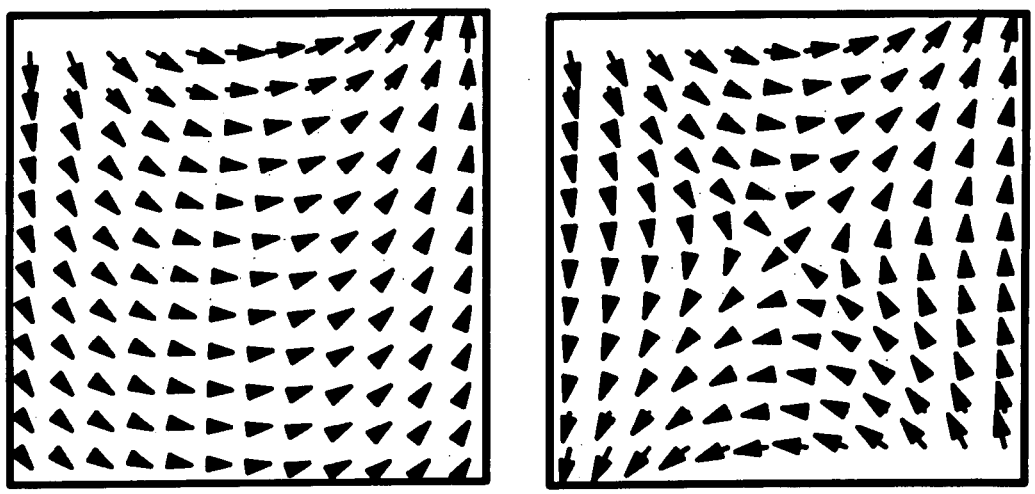
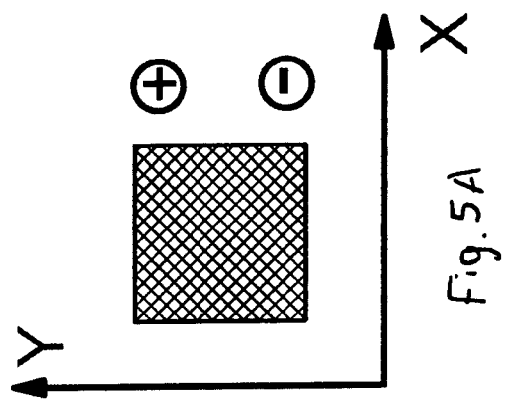 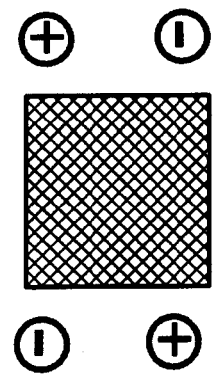
Fig. 5A    Fig. 5B

FERROELECTRIC NANOSTRUCTURE HAVING SWITCHABLE MULTI-STABLE VORTEX STATES

CROSS-REFERENCE TO RELATED APPLICATIONS

This application is a continuation in part of U.S. patent application Ser. No. 11/151,088 filed Jun. 13, 2005, which claims the benefit of U.S. Provisional Application No. 60/580,940 filed Jun. 18, 2004 and U.S. Provisional Application No. 60/632,040 filed Dec. 1, 2004, all of the disclosures of which are incorporated herein by reference.

STATEMENT REGARDING FEDERALLY SPONSORED RESEARCH OR DEVELOPMENT

This work was supported by the Office of Naval Research (Grant Nos. N00014-01-1-0365, N00014-03-1-0598, N00014-01-1-0600, and N00014-04-1-0413), National Science Foundation (Grant Nos. DMR-0116315, DMR-9983678, and DMR-0404335, and MRI Grant No. 0421099), and the Department of Energy (Grant No. DE-FG02-05ER46188). The government has certain rights in the invention.

BACKGROUND OF THE INVENTION

The present invention relates to a method for achieving ultrahigh recording density by use of multi-stable vortex states discovered in ferroelectric nanostructures.

Bulk ferroelectrics undergo structural phase transformations at low temperatures, giving multi-stable (that is, multiple-minimum) degenerate states with spontaneous polarization. Accessing these states by applying, and varying the direction of, an external electric field is a key principle for the operation of devices such as non-volatile ferroelectric random access memories (NFERAMSs) [10]. Interestingly, these properties can dramatically change when going from bulks to nanostructures [50-52]. Compared with bulk ferroelectrics, low-dimensional finite ferroelectric structures promise to increase the storage density of NFERAMs 10,000-fold [8]. But this anticipated benefit hinges on whether phase transitions and multi-stable states still exist in low-dimensional structures. Previous studies have suggested that phase transitions are impossible in one-dimensional systems [27, 28, 41], and become increasingly less likely as dimensionality further decreases [27, 28, 41, 42], thereby limiting the potential towards the capability improvement of NRERAM.

Experimental effort has been made recently in synthesizing and understanding ferroelectric (FE) nanostructures—e.g., $BaTiO_3$ dots [1], rods [2], wires [3], and nanotubes [4], and $Pb(Zr, Ti)O_3$ thin films [5,6] and nanoparticles [7]. However, it is entirely unknown whether it is possible to increase FE nonvolatile-memory density thousands fold by use of individual nanoparticles [3,8,9]. Furthermore, it is not clear whether these FE nanostructures can continue to be useful and efficient in light of miniaturizing piezoelectric transducers and actuators, ultrasonic devices, and medical imaging detectors [10,11]. These technological uses of enormous importance depend critically on whether ferroelectricity exists in these nanostructures. From a fundamental point of view, ferroelectricity is caused by atomic off-center displacements, resulting from a delicate balance between long-range (LR) Coulomb interaction and short-range (SR) covalent interaction [12]. In nanostructures, both interactions—and thus their balance—are altered with respect to the bulk, since the LR interaction is truncated due to lack of periodicity, while the SR one is significantly modified near the surface boundary. Consequently, it is commonly believed [13-16] that ferroelectricity in nanostructures would disappear entirely (i.e., there is no ferroelectric off-center instability) below a critical size. This belief has recently received support from a theoretical study on $BaTiO_3$ thin films [17]. For FE nanoparticles, while measurements of lattice structures (rather than polarization) are available only at large sizes (~500 Å, Refs. [14,15]), the critical size of ferroelectricity (if any) is unknown [1-3,7]. In fact, it is not even clear whether there are any ferroelectric displacements in FE dots and/or whether these displacements are aligned to form long-range ferroelectric phases. Similarly, virtually nothing is known about the electrical and mechanical responses of FE nanoparticles to electric fields.

BRIEF SUMMARY OF THE INVENTION

The present invention increases the data storage capability of non-volatile ferroelectric random access memory (NFERAM) using our newly discovered multiple degenerate states formed by ordered toroid moments in low dimensional nanoscale ferroelectric structures. For instance, at low temperature, ferroelectric nanodisks of lead zirconium titanate (PZT) exhibit two robust bi-stable states with clockwise or counterclockwise concentric vortex rings, and these states with opposite toroid moments can be used as the logic states to store "0" and "1" in memory devices. This approach is drastically different from—and superior to—the conventional approach where macroscopic polarization is used. In fact, macroscopic polarization does not exist in the nanodisks and thus cannot be utilized for the purpose of memory devices.

The minimum size, i.e., the diameter, of the nanodisks that display bi-stable toroid moments is demonstrated to be 2.8 nm. Using the vortex states as discovered in this invention, the ultimate storage density of this approach reaches 80 Terabits/$inch^2$.

The storage density achieved in the present invention far exceeds the current storage capability of 1 GBits/$inch^2$ using magnetic recording. This value is five orders of magnitude higher than that using the conventional approach by use of macroscopic polarization.

Storing data using toroid moments offers superiority over using the usual polarization in many respects.

The multi-stable states of different toroid moments in our approach can be conveniently switched by time-dependent magnetic fields. The latter does not require electrode contact which is challenging to make in nanoscale devices. We also found that the toroid moments can be switched by application of inhomogeneous electric fields. The vortex of the present invention resembles the curling state exhibited by magnetic dots above a certain size [50, 55] and leads to the activation of a macroscopic toroidal moment, which involves the cross product between the $r_i$ vectors locating the i unit cells and their local electrical dipoles $p_i$, i.e., it is defined as $G=(2N)^{-1} \Sigma_i r_i \times p_i$, where the sum runs over the N unit cells of the zero-dimensional (0D) system. The possibility of switching the direction of the toroidal moment opens exciting opportunities for nanomemory devices [53, 56], nanomotors, nanotransducers, nanoswitchers, nanosensors, etc. However, a practical control of the G toroidal moment is rather challenging, mostly due to the fact that electric toroids directly interact with the curl of E but not with a uniform electric field alone [57]. Moreover, a non-vanishing of E can only be produced (according to Maxwell's equations) by a temporal change of the magnetic field, −dB/dt, but the magnitude of the magnetic field necessary to switch the electric toroidal moment is impractical. Furthermore, even if this large magnetic field was reachable, it would disturb a volume of the sample much larger than the nanodot size. As a result, manipulating the toroidal moment of a single nanodot, separately from the toroidal moment of the other dots of the sample, will become impossible—which will thus seriously limit the benefits of using toroids for creating the next generation of devices. (One also needs to be able to "read" the chirality of the vortex of a single nanodot via, e.g., the field produced by its dipoles [53].) The present invention solves this problem by controlling the electric toroidal moment of a single nanodot using an inhomogeneous static electric field. Alternatively, stress is also capable of controlling the vortex's chirality, because of the electromechanical coupling that exists in ferroelectric nanodots. Further, we have discovered an electric toroidal susceptibility tensor that may also be use in switching the toroidal moments of nanoscale ferroelectric devices.

In order to overcome the so-called "cross talk" problem, each memory cell capacitor in the conventional approach is isolated from its neighbors by means of a passgate transistor. On the other hand, by using the toroid moment in our approach, this problem is eliminated since a nanodisk with rotational polarization has a closed electric flux and does not produce any strong long range electric fields that will interact with neighbors. Thus, nanostructures with toroid moments of polarization do not "communicate" with each other despite being small in size and packed more densely.

In addition to its use in NFERAMs, the discovery of ferroelectricity in nanoparticles may be used for piezoelectric sensors, efficient actuators, nano-scale dielectric capacitors for energy storage, and nano-scale ultrasounds for medical use.

BRIEF DESCRIPTION OF THE DRAWINGS

FIG. 1A is a graph of local-mode displacements, $\{u_i\}$, of the cells centered on the y=6th B plane of the 12×12×12 dot under zero electric field. The arrows give the direction of these displacements, projected on the xz plane, and the arrow length indicates the projected magnitude.

FIG. 1B is a graph of the same conditions as FIG. 1A, but under a field of $E=5\times10^8$ V/m applied along the z axis.

FIG. 1C is a graph of the same conditions as FIG. 1A, but under a field of $E=10^9$ V/m applied along the z axis.

FIG. 1D is a graph of local-mode displacements $\{u_i\}$ of the cells centered on the y=12th B plane of the 24×24×24 dot.

FIG. 1E is an illustration of four specific configurations of two dipoles with fixed centers but different orientations. Note that the dipole-dipole electrostatic energy increases from (i) to (iv). The dipoles axis (dotted line) is defined as the straight line connecting the centers of two dipoles.

Figure 2A:
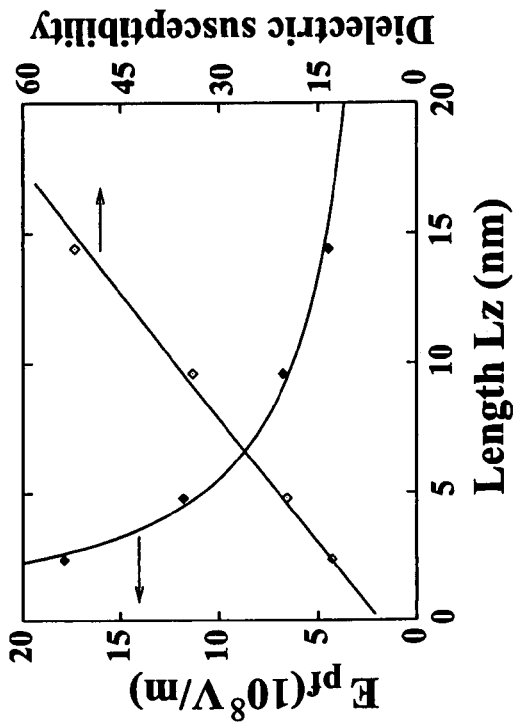
FIG. 2A is a graph of response of the net mode-average $+u_z$, per unit cell, in unit of bulk lattice constant, as a function of electric field in quantum wires of different lengths. Four curves, from bottom to top, correspond to $L_z$=2.4, 4.8, 9.6, and 14.4 nm, respectively. The x-axis and y-axis lengths are both fixed at 4.8 nm.
Figure 2B:
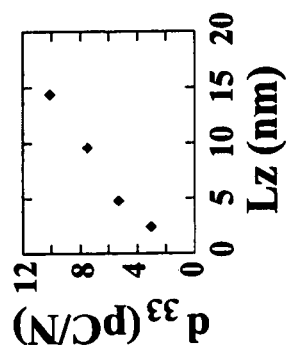
FIG. 2B is a graph of the dependences of the poling field ($E_{pf}$) and the dielectric susceptibility (of stage I) on the wire length $L_z$. This susceptibility is different from the calculated bulk value of ~124, since the latter does not correspond to dipole flipping.

Symbols in FIGS. 2A-D show the direct results of the simulations, while lines are guides for eyes (except in FIG. 2B, where the analytically fitted result for the poling field is shown).

FIGS. 3A-C show the toroid moment G and local dipole pattern in PZT disks and rods.

FIG. 3A is a graph of toroid moments $G_{x,y,z}$ (filled symbols, using the left axis) and average amplitude of off-center displacement +|u|, (in units of bulk lattice constant a, open triangles, using the right axis) as a function of temperature for the (19,14) disk. Temperature is scaled so that the theoretical Curie temperature for bulk Pb(Zr$_{0.5}$Ti$_{0.5}$)O$_3$ matches the experimental value (640 K). Notably, the off-center displacements +|u|, exist far above the transition temperature $T_c$=550 K, and increases (rather than decrease) with temperature above $T_c$. Our simulated +|u|, at 750 K is found to be ~0.08a, which is 75% of the corresponding value at 32 K, in good agreement with the experimental NMR results in bulk PbTiO$_3$ (Ref. [40]) where the local distortion at $T_c$+190 K (being 0.077a for Ti) is 70% of the value at 12K. For $G_z$ near the critical temperature, statistical uncertainty (obtained from averaging over different number of Monte Carlo steps in simulation) is indicated by error bars. A sizable $G_y$ at 500 K is due to statistical fluctuation.

FIG. 3B is a graph of contributions to the total $G_z$ from each (001) plane in the (19,14) disk at 768 K and 64 K. Inset: local dipoles on the central z=7 plane, at 64 K (the magnitude of each dipole is enlarged for clarity).

FIG. 3C is a graph of local dipoles on the central x (the left panel) and y cross-section of the (7,28) rod at 64 K. Local vortices are schematically shown as circles.

FIGS. 4A-C comprise graphs showing size dependence of properties of the A and B phases.

FIG. 4A shows the toroid moment $G_z$ of phase A (triangles, using the left axis) and $G_{xy}$ of phase B (squares, using the right axis), at 64 K.

FIG. 4B shows the critical temperatures for the A and B phases. Notably, the $T_c$ of the A phase (being larger than 350 K) indicates that the toroid moments in PZT nanoparticles are conveniently ready for making a new generation of NFERAMs able to operate at room temperature.

FIG. 4C shows the dipole energy $E_{dip}$, total energy $E_{tot}$ per 5-atom cell, and ratio R=|$E_{n-dip}/E_{dip}$|, at 64 K. Open symbols: A phase (using the left axis); filled symbols: B phase (using the right axis). The size on the horizontal axis in each figure is the diameter D for phase A (while H is fixed at 14), or height H for phase B (while D is fixed at 7). The error bars indicate the statistical uncertainty in the simulations. For those results with less than ±3% uncertainty, error bars are not shown for clarity.

FIGS. 5A and 5B are schematic diagrams of two alternative embodiments for generating inhomogeneous electric fields at the site of a nanodot, and the resulting ground-state dipole pattern.

Figure 6B:
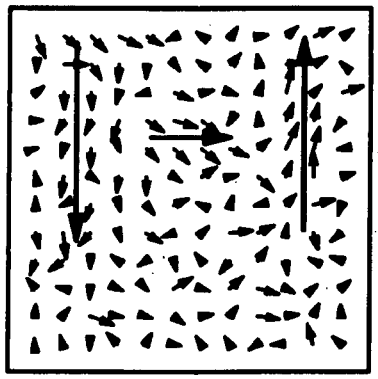
Figure 6C:
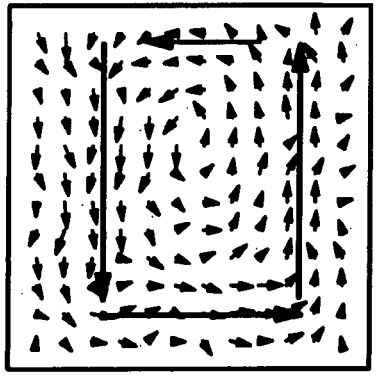
Figure 6D:
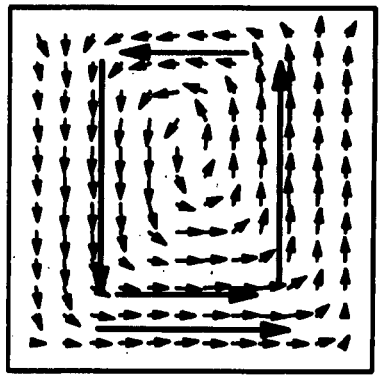
Figure 6A:
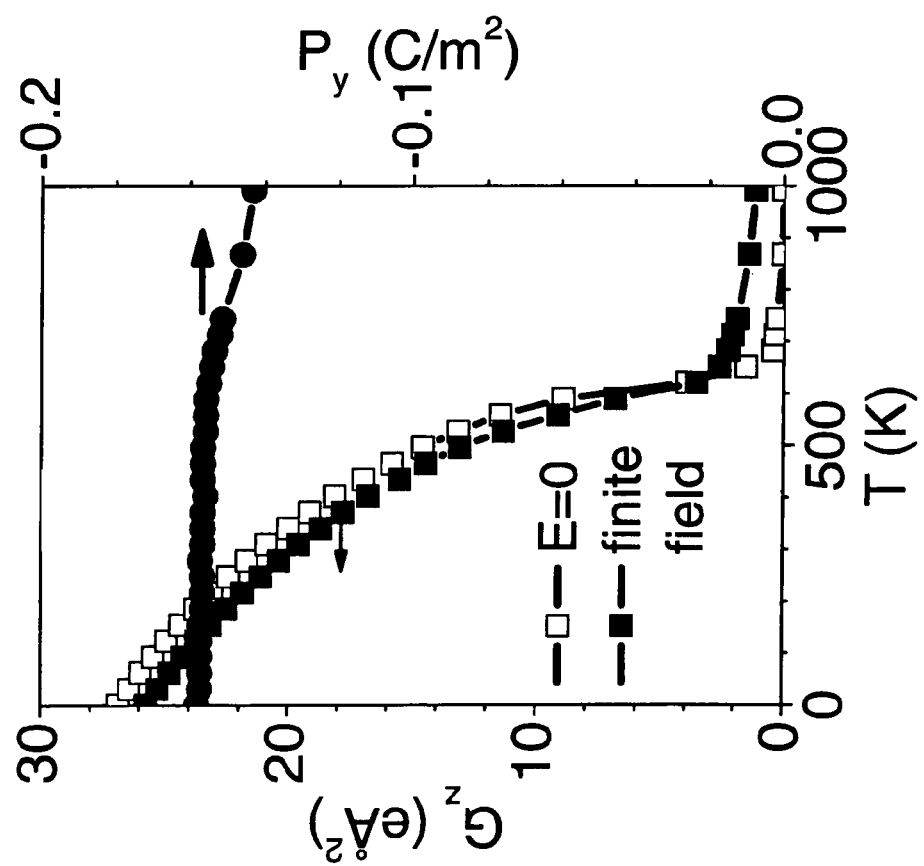

FIG. 6A shows the temperature dependency of the toroidal moment (squares) and polarization (dots) in the embodiment shown in FIG. 5A; and FIGS. 6B-D show the resulting dipole pattern at 625, 300, and 1 K, respectively. The filled symbols of FIG. 6A correspond to simulations in which the inhomogeneous field is turned on while open symbols show results for an isolated dot (that is a dot under no field, and which does not exhibit any polarization). The long and thick arrows of FIGS. 6B-D are guides for the eyes to show the tendency of some dipoles to align along some specific directions. The temperature has been rescaled, as in Ref. [34], to fit the experimental value of the Curie temperature of $Pb(Zr_{0.5}Ti_{0.5})O_3$ solid solution.

Figure 7:
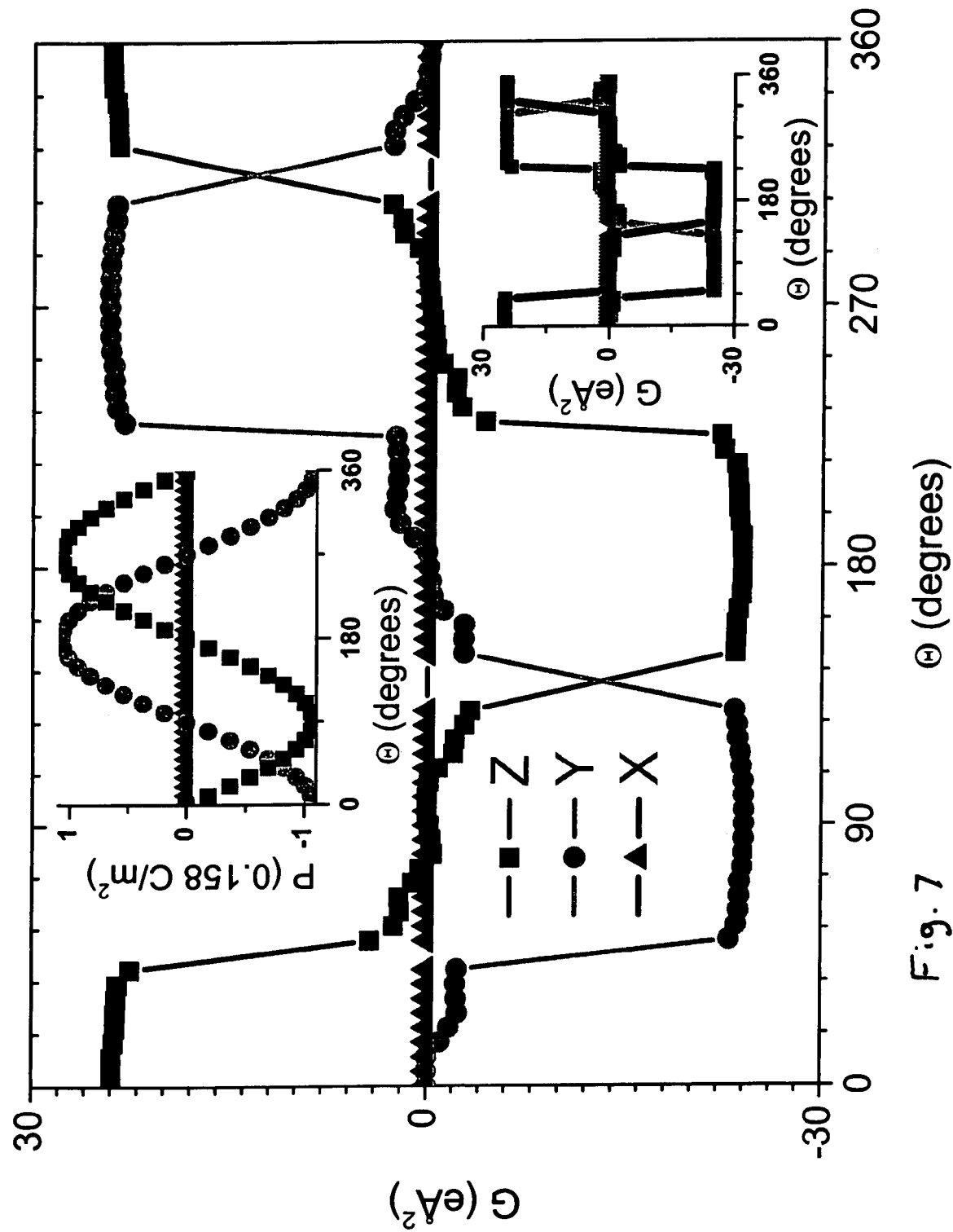

FIG. 7 is a graph of the dependency of the Cartesian components of the ground-state toroidal moment and polarization (in the top inset) on the angle of rotation about the x axis of the dipolar source associated with the embodiment of FIG. 5A. For each angle, the calculations are first performed at high temperature and then slowly cooled down until 1 K. The bottom inset reports the dependency of the ground-state state toroidal moment for the setup of FIG. 5B (for which no polarization exists) with respect to the angle of rotation about the x axis of the two dipolar sources.

Figure 8A:
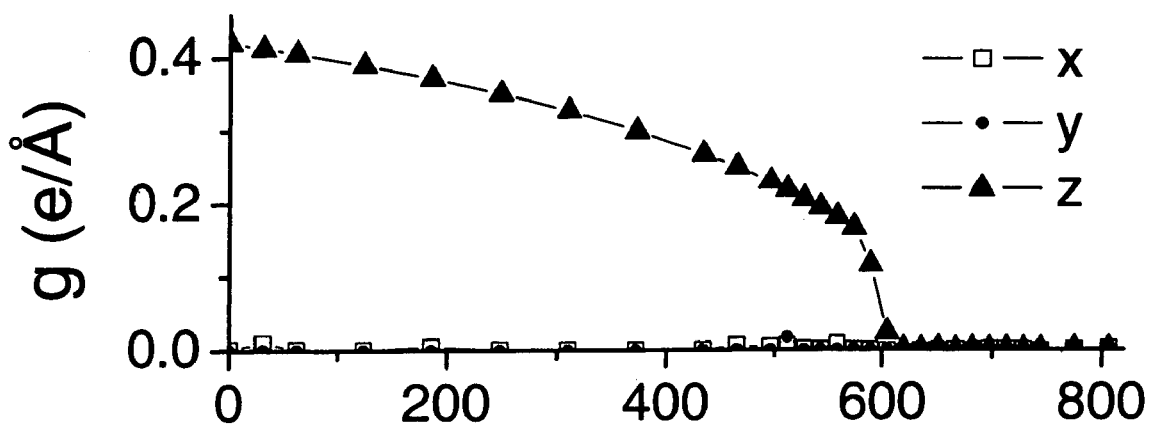
Figure 8B:
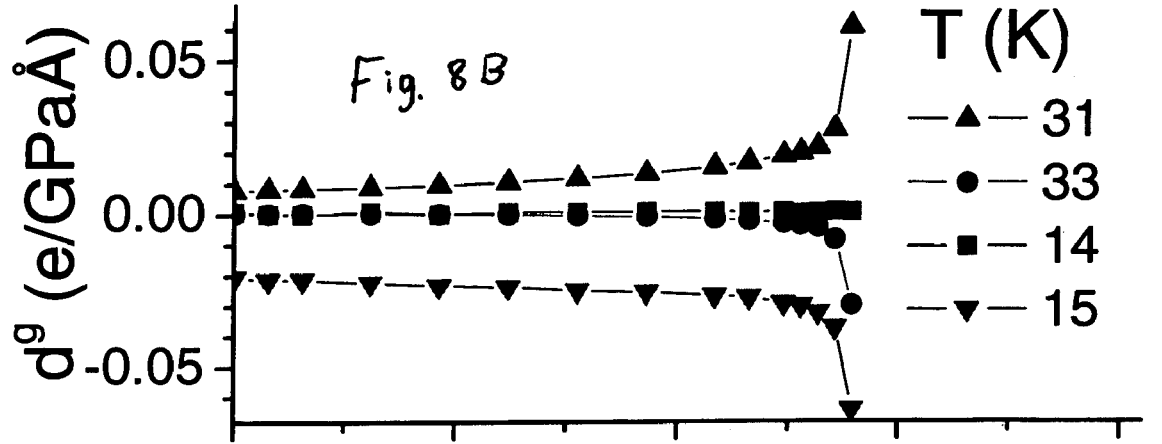
Figure 8C:
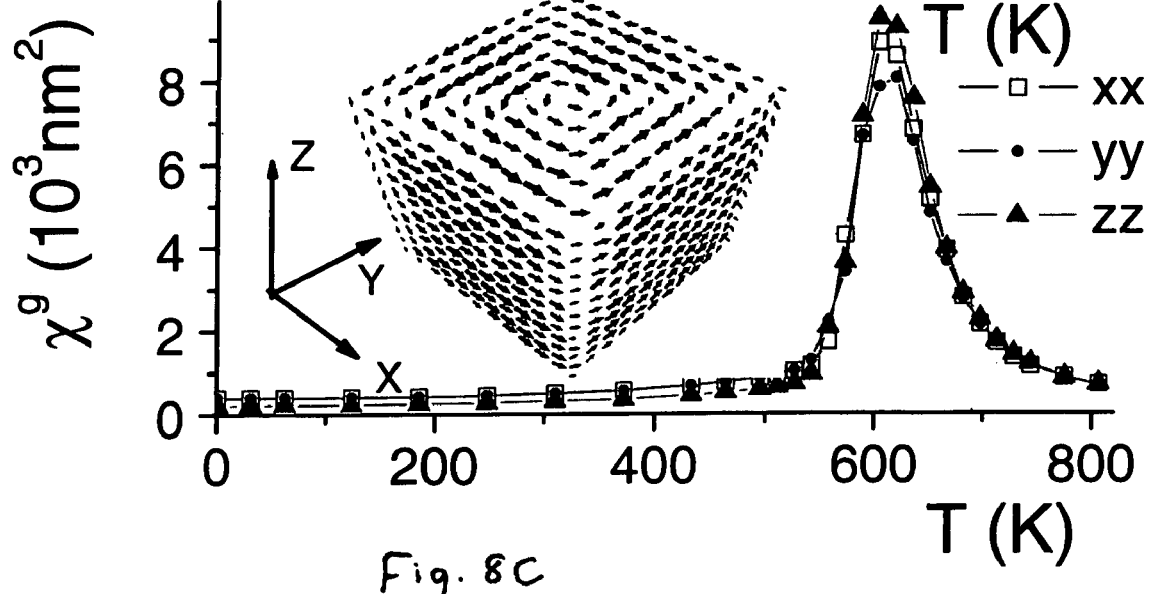

FIG. 8A-C are graphs showing the temperature dependence of the Cartesian components of the toroidal moment in FIG. 8A, axial piezotoroidic coefficients in FIG. 8B, and electric toroidal susceptibility elements in FIG. 8C, for a cubic nanodot of PZT having 48 Å of lateral size, and being under stress-free and open-circuit boundary conditions, as predicted from the first-principles-based technique employed here and from the use of Eqs. (3) and (4). The inset of FIG. 8C shows the dipole vortex structure in the nanodot. The theoretical temperature has been rescaled to match the experimental value of the Curie temperature in PZT bulk.

DETAILED DESCRIPTION OF THE INVENTION

We investigate, from first principles, the ferroelectric properties of $BaTiO_3$ colloidal nanoparticles—and, in particular, answer whether there is ferroelectricity in FE nanoparticles and how these particles respond to applied electric fields. These properties are found to be unusual and differ from what is commonly believed.

Here, we further develop and use a first-principles-derived effective-Hamiltonian approach [18,19] coupled with Monte Carlo simulations. (Ideally, one would like to use direct first-principles density-functional theory, but this is currently computationally impracticable.) The effective Hamiltonians of Refs. [18,19], which are derived from first principles and possess a comparable accuracy, have been successfully applied to many FE materials, including simple $BaTiO_3$ [20], $PbTiO_3$ [21], and $KNbO_3$ [22] systems, and complex $Pb(Zr,Ti)O_3$ [19] and $Pb(Sc, Nb)O_3$ [23] solid solutions. In this approach, local modes $\{u_i\}$ (i is the cell index) describe the ferroelectric instability in individual 5-atom cells; $u_i$ are associated with local electrical dipoles $P_i$ via $P_i=Z^*u_i$ (where $Z^*$ is the effective charge of the local mode).

Compared to the original method detailed in Ref. [18], two new developments are made here in order to be able to study FE nanoparticles: (i) No supercell periodic boundary conditions are imposed, and the LR dipole-dipole interaction is performed in real-space (inside the nanoparticles) rather than in reciprocal space. Our simulations with open-boundary condition precisely mimic the experimental situations [3,5,6] in which polarizations in FE wires and films are probed by non-contact electrostatic forces without metallic electrodes. By contrast, the calculations of $BaTiO_3$ thin films in Ref. [17] assume a short-circuit boundary condition with metallic electrodes surrounding the films. Also note that, in our real-space implementation without artificial periodicity for finite systems, the potential field generated by every dipole in the nanoparticles—including the depolarization field produced by the charges (i.e., uncompensated dipoles) at nanoparticle surfaces—is precisely computed and properly accounted for. (ii) Existence of the vacuum surrounding nanoparticles will cause surface-induced atomic relaxations and cell-shape changes (thus affecting both local modes and local inhomogeneous strains) near the nanoparticle surfaces. To account for the effect of atomic relaxations on local modes, an interaction between local modes at surfaces and the vacuum (denoted as mode-vacuum interaction) is added in the Hamiltonian. Similarly, an interaction between the inhomogeneous strains and the vacuum (denoted as local strain-vacuum interaction) is added to account for the effect of cell-shape changes on local strains. The parameters of these two SR interactions—whose contributions to total energy are analytically similar to the species-dependent inter-site coupling terms of Ref. [19]—are determined from first-principles local-density-approximation (LDA) calculations on $BaTiO_3$ surfaces. Our effective Hamiltonian for FE dots thus includes the dominating effects caused by the vacuum on charge redistribution, atomic relaxations, and cell-shape changes near the surfaces. We assume that the surfaces of nanoparticles are BaO terminated, since they have lower energies than TiO-terminated surfaces [24]. Other interaction parameters used here (to describe the FE material per se) are those of Ref. [20] for bulk $BaTiO_3$, since Ref. [17] demonstrates that these parameters do not change significantly when going from bulk to nanostructures. Local modes $\{u_i\}$ at low temperatures are obtained via temperature-annealing Monte Carlo simulations. A pressure of −4.8 GPa is used in simulations to correct the LDA error in lattice constant. Results presented here are obtained for 50 K.

For simplicity, we assume $BaTiO_3$ dots to be rectangular, since adopting a spherical or a square cross section leads only to a minor difference. The rectangular dots are denoted as $n_x \times n_y \times n_z$, where $n_x$, $n_y$, $n_z$ are the numbers of five-atom cells contained in the dots along the pseudo-cubic [100], [010], and [001] directions, respectively. The average size of a nanoparticle is thus given by $L=(L_x L_y L_z)^{1/3}$, where $L_i=n_i a$ (i=x, y, z) are the lengths along the three Cartesian axes (a=4.0 Å is the lattice constant of $BaTiO_3$). For the clarity of demonstration, our prediction for local modes $\{u_i\}$ will be presented on a certain Perovskite B-site plane, which is specified by its normal direction and its order index among the equivalent planes (e.g., the y=6 plane is the 6th plane having a normal direction along the y axis).

Local modes $\{u_i\}$ on the y=6 plane of a 12×12×12 dot are depicted in FIG. 1A. Significant ferroelectric off-center displacements can be clearly seen in this small (L=4.8 nm) dot. The local-mode magnitude +|u|, averaged over all 5-atom cells, is 0.043a in this dot. This is remarkably large and comparable with the value of 0.039a found in bulk $BaTiO_3$. These large off-center displacements, indicating the existence of significant dipoles in each cell, have an important implication—that is, a large amount of macroscopic polarization can be generated by aligning these local dipoles with electric fields. Note that this effect cannot be achieved in non-ferroelectric nanoparticles without off-center displacements, unless a huge electric field is applied. In fact, other calculations we performed (not presented here) predict that large off-center displacements yielding a magnitude +|u|,=0.052a occur even in the tiny 4×4×4 dot (L=1.6 nm). Conceivably, such a small size is likely the limit achievable in experiments. These results thus suggest that there is virtually no critical size for ferroelectric instability in nanoparticles.

For the dipoles on the dot surfaces, analysis of FIG. 1A shows that the parallel-to-surface components of these dipoles prefer to point along opposite directions on two opposite surfaces, while the (small) normal-to-surface components tend to bulge out due to the surface-induced atomic relaxations. FIG. 1A further reveals that the local dipoles in small dots prefer to rotate from cell to cell, forming an unusual and complex "vortex-like" pattern (similar to the ones found in some magnetic compounds). Note that this vortex pattern in FE dots is different from the ferroelectric pattern in bulk (where all dipoles are aligned along the same direction, as predicted by similar-size supercell effective-Hamiltonian simulations or assumed in five-atom first-principles calculations). Interestingly, as a result of the dipole pattern in FIG. 1A the total macroscopic polarization is found to be zero (i.e., +u,=0). Furthermore, we found that the vortex pattern of displacements does not alter appreciably when turning off and on the mode-vacuum SR interaction. This suggests another important conclusion, namely, that ferroelectric instability in dots is not much affected by the surface local environments or, equivalently, that the capping organic matrix materials used in experiments should not affect the ferroelectric properties of the dots. Unlike in Ref. [17] where charges in metallic electrodes are able to move freely and will thus cause strong screening, the organic capping materials used in colloidal FE nanoparticles [1,2,7] are insulators of large gap (~10 eV) and the resulting screening is very small. As the dot increases in size to 24×24×24, the local FE displacements tend to order between each other via the formation of eight rather uniform ferroelectric domains as shown in FIG. 1D. The polarization of each domain in FIG. 1D is found to point along one of the eight pseudo-cubic [±1±1±1] directions. The macroscopic polarization of the entire dot remains as zero.

The displacement pattern in FIG. 1A results from a new balance (with respect to the bulk case) between the LR and SR interactions in dots, and can be simply explained as follows. First, let us consider the LR dipole-dipole interaction alone for two isolated dipoles (with four specific orientations illustrated in FIG. 1E); the lowest-energy configuration is that these two dipoles both point at the same direction along the dipole axis (case (i) in FIG. 1E). Indeed, it can be seen in FIG. 1A that the dipoles belonging to a same row have their parallel-to-dipole-axis (i.e., the z axis) components aligned along the same direction. (Note that dipoles on the dot surfaces are exceptions, see below.) Next, let us select a given row in FIG. 1A, and note that the dipoles located near the nanoparticle surfaces in this row tend to have large parallel-to-surface (in-plane) components with their normal components suppressed by the vacuum; these in-plane components (being perpendicular to the dipole axis) shall flip their directions (since case (ii) has a lower energy than case (iii) in FIG. 1E). However, this flip of the component perpendicular to the z axis does not occur within the nearest cell (see FIG. 1A), since we found that it will otherwise drastically increase the short-range energy. Instead, the flip occurs across the entire dot, forming the unusual pattern in FIG. 1A.

Now we turn our attention to electric-field effects in nanoparticles. More precisely, we are particularly interested in revealing the size dependences of these effects. We decide to elongate the nanoparticles only along the z axis (that is, the applied-field direction) to mimic quantum wires, partly because increasing the dot size along all three dimensions is computationally prohibitive. FIG. 2A shows the resulting net z axis mode average ($u_z$) and clearly indicates that the same electric field induces a larger polarization per five-atom cell in a long wire than in a short wire. Field effects in FE dots thus depend substantially on sizes. This is the first time that the size dependence of field-induced polarization is firmly established (to our knowledge). FIG. 2A further reveals that a small electric field in long wires drives a rapidly increasing polarization and thus easily turns a (macroscopically) paraelectric FE nanostructure into a (macroscopically) ferroelectric phase. Here we define the poling field $E_{pf}$ as the field that is needed to drive a net average displacement +$u_z$, equal to the bulk value of 0.02a. The poling fields for different-size wires are given in FIG. 2A, and drastically decrease when increasing size. More precisely, fitting our theoretical data in FIG. 2B as a function of size gives $E_{pf}=38.1966/L_z^n$ with n=0.7821, where $E_{pf}$ is in unit of $10^8$ V/m and $L_z$ in unit of nm.

Our predictions provide explanations and/or suggest reinterpretations of many experimental results. For instance, no detectable polarizations were probed by electrostatic force microscopy along the perpendicular directions of both as-deposited $BaTiO_3$ nanowires [3] and as-grown PZT films [5]. This can be simply explained by the vanishing net polarizations we found in dots and in wires (see e.g., FIG. 1A). Our findings further suggest that the non-detectable polarization in PZT films may not be due to the electrostatic passivation of additional charges at sample surfaces as it was speculated [5], but rather results from the "intrinsic" arrangement of local dipoles. Moreover, it was found experimentally [3] that a field of $3.6 \times 10^8$ V/m is needed to "write" a polarization along the perpendicular direction of an 18 nm diameter $BaTiO_3$ wire, which is in excellent agreement with our predicted value of $3.98 \times 10^8$ V/m obtained from the formula given above.

We now provide a microscopic understanding of the field-induced responses in FE dots. We find that the responses in FIG. 2A can be separated into three stages according to their +$u_z$,-vs-field behaviors, and here we use the 12×12×12 dot to illustrate these stages. (I) At stage I (that occurs at field $E < 10^9$ V/m), the dipoles pointing opposite to the field direction are sequentially flipped (FIG. 1B). The flip process occurs first near the domain boundary, while dipoles on the dot surface are found to be more resistant to the applied field (see FIG. 1B). Stage I generates a polarization that varies linearly with the field strength (FIG. 2A). The slope (i.e., dielectric susceptibility) is given in FIG. 2B for different wires and is found to increase linearly with the wire length. (2) At stage II ($10^9 < E < 4 \times 10^9$ V/M), the dipoles start to rotate towards the field direction as the dipole flips of stage I have been completed (FIG. 1C). Stage II differs from the polarization rotation in bulk [25,26] in that, prior to the rotation, local dipoles in dots are not aligned parallel as in bulk. Interestingly, this second stage yields a strong nonlinear field dependence of polarization (FIG. 2A). (3) At stage III ($E > 4 \times 10^9$ V/m), with the dipoles having all been previously rotated along the field direction, the magnitude of each dipole then starts to be enlarged by the field, resulting in a nearly linear field-dependent polarization again.

Figure 2C:
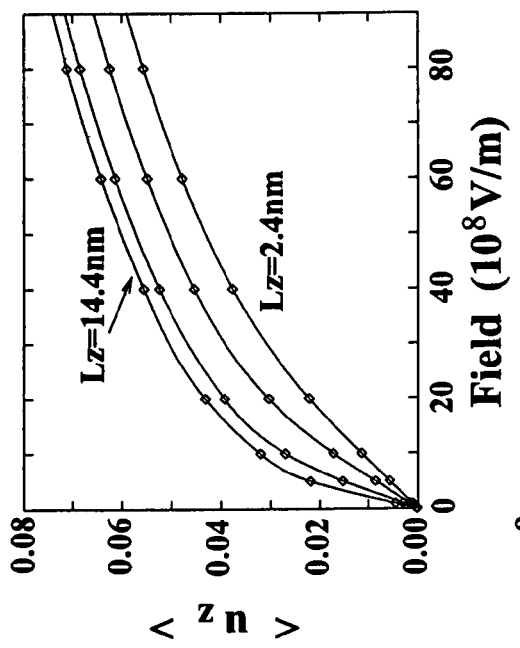
FIG. 2C is a graph of response of the strain $\eta_3$ to the applied electric fields in four different wires considered in FIG. 2A.
Figure 2D:
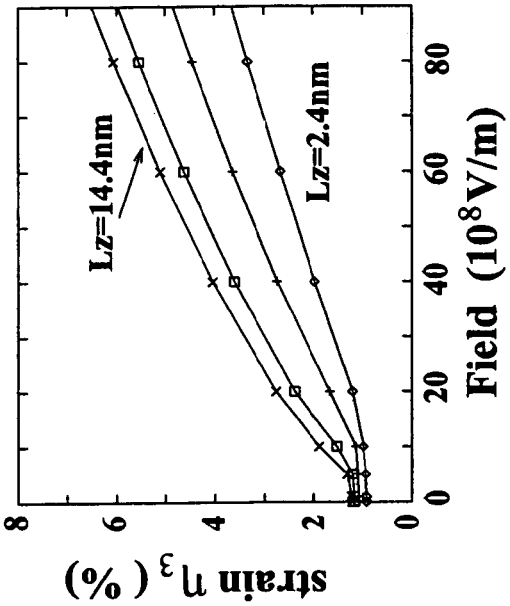
FIG. 2D is a graph of the piezoelectric coefficient $d_{33}$ (of stage II) as a function of the wire length.

Finally, we examine the electromechanical response in FE wires. The field-induced $\eta_3$ strains are depicted in FIG. 2C. At stage I, the strain response is found to be surprisingly small though there is a rapid increase in polarization, which suggests that polarization does not couple with strain during the dipole flipping process. At stage II, the strain increases evidently with the field strength (FIG. 2C); the strain-vs-field slope is the piezoelectric coefficient $d_{33}$. The $d_{33}$ values are given in FIG. 2D for different wires, and exhibit a monotonous increase with size. Interestingly, the $d_{33}$ coefficients in nanoparticles (~10 pC/N) are found to be much smaller than in bulk (18 77 pC/N), suggesting that the electromechanical response can be drastically modified by varying sizes.

In summary, we find: (i) Large ferroelectric off-center displacements exist in very small (~5 nm) dots. This result solves a long-standing puzzling question in experiments, namely, whether there exists ferroelectricity in colloidal FE dots under zero field. This discovery also opens a possibility of tremendous increase in FE-memory density. (ii) FE displacements in dots exhibit an unusual and hitherto-unknown vortex pattern. This pattern is found to cause rather peculiar field-induced polarization responses. (iii) The ferroelectric instability in dots is found to be robust against the organic capping materials. (iv) The poling field is predicted to decrease drastically with increasing size, which is important for practical controls of FE nanostructures by use of external electric fields. (v) The polarization responses of FE dots at stage II are found to be strongly nonlinear, while the electromechanical responses in dots are found to be remarkably smaller than those in the bulk.

We perform further ab initio studies of ferroelectric nanoscale disks and rods of technologically-important Pb(Zr,Ti)O$_3$ solid solutions, and demonstrate the existence of previously unknown phase transitions in zero-dimensional ferroelectric nanoparticles. The minimum diameter of the disks that display low-temperature structural bi-stability is determined to be 3.2 nm, enabling an ultimate NFERAM density of 60×10$^{12}$ bits per square inch—that is, five orders of magnitude larger than those currently available [30]. Our results suggest an innovative use of ferroelectric nanostructures for data storage, and are of fundamental value for the theory of phase transition in systems of low-dimensionality.

One main difference between ferroelectric (FE) nanostructures and (infinite) bulk materials is the existence in the former of depolarizing fields, because of the uncompensated charges at the surface [43]. The depolarizing field (the magnitude of which can be as high as 10$^4$ kV cm$^{-1}$) is able to quench spontaneous polarization; this is consistent with the recent experimental and theoretical findings that the ground states of finite free-standing FE samples remain paraelectric at very low temperature (50K) [3,32]. To induce sizable polarizations, external electric fields [3, 5]—or equivalently, as pointed out in Ref. [32], short-circuit boundary conditions [17, 21]—are needed to screen the depolarizing field. As the external fields vanish, the induced polarizations are expected to relax to the ground state of non-polarity, with the relaxation time decreasing exponentially with reducing size, which hampers the miniaturization of nanoscale NFERAMs. Further, a large external electric field is needed to reverse the polarization and to swap charges in electrodes in order to rewrite data bits.

Whether phase transitions still occur in low-dimensional structures has been a subject of long-standing fundamental interest for understanding and revealing collective interactions [27,28,41,42]. For instance, Ref. [27] predicts that the thermal fluctuation of acoustic phonons and the entropy due to domain formation disfavor long-range ordering of local dipoles in one-dimensional systems, without any transition to phases with spontaneous polarization. Similarly, using a spin-lattice model, Mermin and Wagner showed that no spontaneous magnetic ordering exists in one-dimensional systems [28].

Here we report state-of-the-art ab initio simulations, which lead to the discovery that (1) phase transitions do in fact exist in zero-dimensional FE nanostructures; (2) these phase transitions differ profoundly from those occurring in bulk material, in the sense that they lead to the formation of spontaneous toroid moment [44] rather than spontaneous polarization, below a critical temperature; (3) the unusual characteristics of the resulting low-temperature phases promise the generation of new NFERAM devices with remarkable capabilities. Our simulations also reveal the precise role of finite-size effects on toroid moments.

We study free-standing nanoparticles of Perovskite Pb(Zr$_{0.5}$Ti$_{0.5}$)O$_3$ (PZT) solid solution—the most promising candidate for nano-NFERAM and nano-MEMS [8, 33]. The investigated nanoparticles all have a cylindrical shape, with diameter D and height H (both in units of bulk lattice constant a=4 Å); the cylindrical z-axis is chosen to be along the pseudo-cubic [001] direction, with the x and y axes along the [100] and [010] directions, respectively. Particles with D>H and D<H are referred to as disks and rods, respectively, and each particle is named as (D,H). A variety of combinations of D and H, ranging from 5 to 30, are considered here.

Technically, a first-principles-derived effective-Hamiltonian [18,19] is used to determine the energetics and local dipoles in each Perovskite five-atom cell. (This Hamiltonian has been shown to reproduce well the observed thermodynamic behavior of bulk PZT, including the occurrence of an unusual monoclinic phase for a small range of Ti composition [19,35].) Nanoparticles surrounded by vacuum are mimicked without periodic boundary conditions; details of our approach for FE nanoparticles are described elsewhere [31]. The validity of this approach was demonstrated by the accurate determination of the poling fields in BaTiO$_3$ dots [31], as well as by the theoretical study of ultra-thin PZT films under compressive strains that yields a 180° stripe domain [45], in agreement with experimental observation [46]. Here we focus on atomically disordered PZT nanostructures, which are consistent with the chemical nature of bulk PZT [36].

For all simulated nanoparticles, the total net polarization P=N$^{-1}$Σp$_i$ (where p$_i$ is the local dipole of the cell i located at R$_i$, and N is the number of cells in the simulation) is found to be null down to 10 K. Unlike previous studies that mainly focus on spontaneous polarization as the evidence of phase transition, we, on the other hand, discover a new order parameter—namely, the toroid moment G of polarization—defined as $$G=(2N)^{-1}\Sigma_i R_i \times p_i \qquad (1)$$

FIG. 3A shows that the z-component of toroid moment, G$_z$, of the (19,14) disk increases sharply below 600K while being zero at higher temperature (the G$_x$ and G$_y$ components remain nearly null at all temperatures). This indicates that an ordering associated with local dipoles occurs in this zero-dimensional disk below a certain critical temperature, T$_c$. We further found that the specific heat (not shown here) exhibits a hump around 550K, which provides a quantitative measure of T$_c$ and further confirms the existence of a phase transition.

In order to gain a microscopic insight into this unusual phase transition, FIG. 3B shows the contribution of each (001) plane in the (19,14) disk to the total G$_z$ at high (768K) and low (64 K) temperature. One can clearly see that the moments of individual planes are all small and random at 768 K. On the other hand, these moments markedly increase in magnitude, and also spontaneously order along the z direction, when the temperature is lowered. These low-temperature local toroid moments are predicted to be nearly identical in each (001) plane, except near the surface layers. The resulting ordered phase, which we denote as phase A, is characterized by either clockwise or anti-clockwise vortices in each z plane, with a vortex in the central z plane displayed in the inset of FIG. 3B.

We now explore how this peculiar A phase, and its characteristics, evolve as a function of diameter D for a fixed height H (chosen here to be 14). The most notable results are that: (1) the A phase is found to be stable (at low temperature) "only" above a critical value of D—denoted by D$_{c,A}$, and equal to 8 when H=14; (2) low-temperature toroid moment G$_z$ increases in magnitude as the diameter becomes larger, with an inflexion point occurring in the G$_z$-D curve when meeting the D=H equality—that is, when nanorods become nanodisks (see FIG. 4A); (3) the $T_c$ of nanorods (D<H) markedly increases as D increases, whereas nanodisks (D>H) exhibit a diameter-insensitive $T_c$ (see FIG. 4B).

Result (1), indicated above, raises the question of what structurally happens at low temperature in FE nanoparticles with diameter smaller than $D_{c,A}$. We numerically found that below a second critical diameter (to be referred to as $D_{c,B}$ and equal to 6 when H=14), no vortices exist in any plane, yielding a vanishing total toroid moment. On the other hand, substantial off-center displacements still occur, with the spontaneous polarization being still null. The resulting macroscopically "non-polar" and "non-toroidal" phase can be characterized as spin-glass type [38] and will be denoted as the SG phase. Another feature that we discover is that the A phase does not directly transform into this glass-type SG phase, when decreasing the diameter. In fact, when D ranges between $D_{c,A}$ and $D_{c,B}$, a new structural phase—to be referred to as the B phase—forms. The arrangement of the local dipoles in this B phase is depicted in FIG. 3C, for the (7,28) nanorod and at low temperature.

Like the A phase and unlike the SG phase, phase B exhibits vortices with non-zero local toroid moments. However, unlike the A phase, the toroid moments of phase B have x and y components but no z component. Specifically, FIG. 3C shows that, in the (7,28) nanorod, four vortices appear in the central x (as well as y) cross-section—and intriguingly, each vortex is found to have a diameter nearly the size of D, with two neighboring vortices having opposite local toroid moments. The total toroid moment, unlike the local toroid moments, is thus relatively small in the B phase. This B phase can be thought as an intermediate phase between the A phase (characterized by large local and total toroid moments) and the SG phase (for which there is neither local nor total toroid moment), occurring via the quasi-annihilation of the total, but not local, toroid moment. Furthermore, FIG. 3C shows that the edges of the vortices on the x plane go through the centers of the vortices in the y plane: two sets of vortices in the B phase are therefore interconnected like links in a chain. As a result, the local toroid moments adopt a helix-like ordering with a period $\lambda=2D$, and this B phase is 16-fold degenerate.

FIG. 4A shows the evolution of the magnitude of total toroid moment $G_z=(G_x^2+G_y^2)^{1/2}$ in the B phase, as a function of the rod height at low temperature. We can see that this magnitude is relatively small with respect to the $G_z$ of the A phase, and decreases non-monotonically as H increases. Moreover, FIG. 4B shows that the critical temperature at which the B phase forms is considerably lower than the $T_c$ at which the A phase appears.

The local dipoles in ordered A phase bear a remarkable resemblance to the molecule orientations in the so-called smectic (respectively, cholesteric) phase of liquid crystals [37]—and the ordered dipoles in B phase resemble orientations in the cholesteric phase. The above FE patterns in A or B phases are found to be robust, in the sense that they do not depend significantly on the surface termination of nanoparticles, or on whether the short-range interaction between vacuum and the local modes beyond the first surface layer is included or not in the simulations, since these patterns are predominantly determined by the long-range electrostatic interaction.

To understand the stabilities of phases A and B, the total energy $E_{tot}$ and dipole energy $E_{dip}$ were determined, and are shown in FIG. 4C at a fixed and low (64 K) temperature. We find that the delicate balance between non-dipolar and dipolar interactions (such balance is believed to play a critical role in affecting the collective behavior of ferroelectrics [12], and is here described quantitatively by the ratio $R=IE_{n-dip}/E_{dip}I$, where $E_{n-dip}=E_{tot}-E_{dip}$ is, surprisingly, mostly size-independent—being 0.92 and 0.97 for the A and B phases, respectively. However, the stability energy $E_{tot}$ progressively decreases in magnitude when D is reduced in phase A, which explains the size-dependence of the critical temperature (for the A phase to appear) in FIG. 4B. Furthermore, $IE_{tot}I$ of phase B (~4 meV) is substantially smaller than its counterpart in phase A, hence leading to much lower critical temperatures.

The occurrence of phase transitions in zero-dimensional nanoparticles, in contrast with the predictions for one-dimensional systems [27,28], has a rather simple explanation. FE domains prevent phase transitions from occurring in one-dimensional systems because they are able to lower the Helmholtz free energy $F=E_{tot}-TS$ by increasing the entropy S. On the other hand, these domains become energetically unfavorable in zero-dimensional nanostructures (therefore allowing the existence of phase transitions) because the typical size $d_{PD}$ of three-dimensionally confined zero-dimensional domains (denoted as particle domains) is on the order of 100 nm according to experimental measurement [47] and thus substantially larger than the size of the studied nanoparticles. We shall point out that $d_{PD}$ is much larger than the size of planar domains in bulk materials [48], because the small surface-to-bulk ratio in the latter case decreases the strain energy at domain interface and thus allows narrower domains. Also, $d_{PD}$ is significantly different (as it should be) from the small size (~2 nm) of stripe domains found in compressed ultrathin films [45,46] where the substrate-enhanced out-of-plane polarization causes the attractive electrostatic interaction between different domains to become dominating, and in contrast, the strain energy at the domain interface due to short-range bond distortion plays only a minor role (which explains why the domain size can be small). Theoretical determination of $d_{PD}$ is hindered by the limits of computing facilities. In either A or B phase, the local dipoles are ordered in a specific way that minimizes the depolarizing field, while simultaneously forming toroid moments, as in some magnetic systems [39]. A possible alternative way to eliminate the depolarizing field is to form 180° domains with polarization in each region pointing along +z or −z direction. This configuration is found, however, to be less stable by our constrained simulation (in which only the z component of each dipole is non-zero and allowed to relax): the energy per 5-atom cell in the (19,14) disk of such 180° domains is determined to be −11 meV, much higher than that of the ground state with toroid moment (−32 meV).

We now consider if the existence of a macroscopic toroid moment, as in phase A—rather than a spontaneous polarization, as in bulk ferroelectrics—can lead to the design of new or improved technological devices. Here it is important to realize that phase A is bi-stable (that is, the toroid moment can be equivalently parallel or anti-parallel to the z axis). Unlike the situation in bulk ferroelectrics where states with differently-oriented polarization can be accessed via a static external electric-field, we can switch from one minimum of phase A to the other by applying a time-dependent magnetic field. This magnetic field, generating a curling electric field via $\Lambda\times E=-MB/Mt$, interacts with the total toroid moment of the PZT particles, as described by the energetic term $E_{int}=-(2N)^{-1}\Sigma_i p_i[R_i\times(\Lambda\times E)]G\, MB/Mt$. The coercive field MB/Mt to switch the toroid moment of the (19,14) disk is estimated from the total energy $E_{tot}$ to be 1.6 mV/Å² (the real coercive field may be different because of nucleation and tunneling).

Storing data using switchable macroscopic toroid moment could be superior to using spontaneous polarization, because generating a magnetic field—unlike the generation of electric field—does not require electrode contact which is challenging to make in nano-scale devices. Furthermore, a large number of particles have to be arranged into regular arrays for memory nanodevices to be efficient, but they should not interact strongly (in order to avoid the so-called "cross-talk" problem). Phase A does not exhibit any macroscopic polarization, nor produce a strong electric field that has a long-range character. The vortex structure of phase A in a single nanoparticle can therefore be switched without modifying the states of its neighboring particles. Consequently, the toroid carriers of information can thus be packed considerably more densely than the conventional carriers of polarization, giving rise to a marked improvement in the density of ferroelectric recording. For instance, the minimum diameter that we found being able to generate bi-stable toroid states is 3.2 nm. This produces an ultrahigh storage density of 60 Tbit inch$^{-2}$, which is five orders of magnitude larger than current NFERAM capability [30] of 0.2 Gbit inch$^{-2}$. Such a promising capability also far surpasses the 1 Gbit inch$^{-2}$ density of typical magnetic recording.

We also examined the electric field generated by the toroid phase in the (19,14) disk, and found that this field is measurable in the proximity of the nanodisk (being about $5 \times 10^6$ Vm$^{-1}$ at 2 nm above the disk), though it decays away quickly (thus implying that virtually no cross-talking occurs). Furthermore, the electric-field pattern (namely, the spatial dependence of the field magnitude and direction) generated by the toroidally-ordered dipoles is found to be very different from that generated by aligned local polarizations. Measuring the electrostatic field using atomic-force-microscope tips may thus confirm the existence of toroid moments and read the memory bits. The toroidally ordered structure might also be revealed by studying the fine structure of synchrotron x-ray diffraction of nanodisk arrays [46].

As an alternative to the use of time-dependent magnetic fields for switching the toroid moment, we now consider the first-principles-based Monte Carlo scheme of Ref. [31] to study a 12×12×12 stress-free cubic dot that is under open-circuit electrical boundary conditions and that is made of Pb(Zr$_{0.4}$Ti$_{0.6}$)O$_3$ (PZT)—with the surfaces being Pb—O terminated. This scheme generalizes to 0D systems the alloy effective Hamiltonian method proposed in Ref. [34] for bulks, by (i) substituting the dipole-dipole interaction of infinite three-dimensional systems by the corresponding interaction in 0D materials [54]; and (ii) incorporating surface-induced atomic relaxations that are caused by the vacuum surrounding the dot—with the governing parameters having been fitted to first-principles calculations on Pb—O terminated PZT thin films [58]. We consider a transverse inhomogeneous electric field arising from charges located away from the studied dot, and incorporate the interaction between the dipoles in the dot and this field in the total energy provided by the effective-Hamiltonian method. The temperature is decreased by small steps, and the x, y, and z axis are chosen along the pseudocubic [100], [010], and [001] directions, respectively.

FIGS. 5A and 5B show the two embodiments that we considered, as well as the resulting inhomogeneous field and ground-state dipole pattern in the dot. In practice, such embodiments and inhomogeneous fields can be generated by, e.g., piezoforce-microscopy tip(s), nanowires, switching ferroelectric dots, or other original methods.

Let us first discuss the embodiment of FIG. 5A. The dipolar source of the field is made of two opposite charges of $2 \times 10^{-7}$ C distant of 15 primitive unit cells along the x axis from the center of the investigated dot—resulting in a field magnitude of about $2 \times 10^8$ V/m in the center of this dot. One interesting result of FIG. 5A is that the studied dot under this inhomogeneous field maintains a vortex structure at low temperature. The interactions between the dipoles of the dot under open-circuit conditions and the inhomogeneous field are thus not strong enough to overcome the depolarizing-field effects responsible for the existence of a toroidal moment in an isolated dot [53, 54]. (One can, in fact, "break" this vortex structure by applying fields with magnitude several times larger than the one shown in FIG. 5A, but such huge fields are unrealistic.) FIG. 5A also reveals that dipoles located at the left side of the dot, as well as those located at the bottom and top of the dot, are following in overall the inhomogeneous field. On the other hand, at the right side of the dot, some dipoles are directed against this field despite the fact that the field is rather strong there. Fighting against these strong fields results in dipoles smaller in magnitude at the right side of the dot than those at the left side of the dot. This leads to the appearance of a spontaneous polarization along the −y axis— while the toroidal moment is along the +z axis. In other words and unlike in the isolated dot (that is in the dot under no field) [53], toroidal moment and polarization coexist in the dot under the inhomogeneous field associated with the first setup. (This polarization is weak, namely 0.158 C/m$^2$ to be compared with the polarization of ∼1 C/m$^2$ for bulk PZT.) As we will see later, the understanding of the dipole arrangement of FIG. 5A is the key to allow an efficient control of the toroidal moment's direction.

FIG. 6A displays the temperature dependency of G—computed with respect to the dot center—switching on and off the field of FIG. 5A. This inhomogeneous field has two rather weak-in-magnitude effects on G, namely, it makes the toroidal moment slightly smaller at low temperature and results in a high-temperature tail—which is reminiscent of the polarization tail exhibited by ferroelectric bulks subject to an homogeneous electric field. Note, however, that the toroidal moment of the ground state in the isolated dot can be along any of the six [001] directions while its direction is unique when the inhomogeneous field is turned on. FIG. 6A also displays the temperature dependency of the spontaneous polarization in the dot experiencing the conditions associated with the first setup. Our simulations reveal that this polarization exists at the highest considered temperatures and is mostly independent of temperature below ∼600 K. This weak polarization is thus solely caused by the field rather than the (temperature-dependent) polarization instability.

The resulting change of the dipole pattern with temperature is shown in FIGS. 6B-6D. At high temperatures, dipoles located at the top and bottom parts of the dot along the y axis follow the inhomogeneous field displayed in FIG. 5A. They thus preferentially align in opposite directions along the x axis. A plane-by-plane decomposition of G (not presented here) undoubtedly indicates that these anti-phase chains are responsible for the high-temperature tail of G seen in FIG. 6A. Furthermore, the dipoles located outside these chains have a slight tendency to exhibit a component along −y. This results in the weak polarization. FIGS. 6B-6D further show that these anti-phase chains elongate along the x axis with their dipoles becoming bigger in magnitude as temperature is decreased. These anti-phase chains constitute a nucleus for G to develop by forcing the dipoles in the other parts of the dot to change their directions as temperature decreases, in order to generate a "full" vortex (which provides the lowest electrostatic energy). Some dipoles on the left and right sides of the dot are thus now anti-parallel and parallel to the y axis, respectively, and all increase in magnitude as the temperature is decreased—which explains why G significantly increases when decreasing the temperature, see FIG. 6A. The direction of G is thus determined by the anti-phase chains of dipoles located at the top and bottom of the dot, and resulting from following the inhomogeneous field there. Such effect implies that rotating the source of the inhomogeneous field should affect the direction of G. Such possible control of the toroidal moment is indeed confirmed by FIG. 7, which shows the computed dependency of the toroidal moment (and polarization) on the θ angle of the rotation about the x axis of the dipolar source in the embodiment schematized in FIG. 5A. For instance, reversing the source of the inhomogeneous field (that is, when θ is varied from 0 to 180°) leads to G, which is now anti-parallel rather than parallel to the z axis—as well as a polarization that is now parallel to the y axis. FIG. 7 further indicates that the toroidal moment nearly abruptly changes direction by 90° for Θ equal to 45°, 135°, 225°, and 315°, while the (weak) polarization is a smooth function of Θ. Such behavior indicates that the six [001] minima of G are not flat and have 90°-energy barriers that are smaller than their 180°-energy barriers.

We now consider if some particular inhomogeneous fields can lead to a toroidal moment that can still be controlled but that does not coexist with any polarization. (A polarization can hinder the benefits of having toroidal moments for future applications because polarizations, unlike toroidal moments, of different dots would interact strongly [53].) The embodiment of FIG. 5B is an example of how to achieve that, and consists in symmetrically placing two opposite dipolar sources at the left and right sides of the studied dot, respectively. Note, in particular, that (i) the fields are now equally strong at the left and right sides of the dot; and (ii) the anti-phase chains of dipoles still occurring at the bottom and top y regions of the dot are now forcing some dipoles in the right and left sides of the dots to lie against these fields in order to create a full vortex (see FIG. 5B). The bottom inset of FIG. 7 also shows that the toroidal moment can indeed be controlled for the setup displayed in FIG. 5B by playing with the orientation of the dipolar sources. In particular, the simultaneous reversal of the two sources of FIG. 5B results in a toroidal moment switching its direction from +z to −z (without creating any polarization).

Let us now understand why the second embodiment does not produce any polarization, and why we numerically find (not presented here) that an homogeneous field is unable to control the toroidal moment's direction in the dot while generating a nonzero polarization. For that, it is enough to consider the linear response of the $p_i(E_i)$ dipole at the site i with respect to the $E_i$ field located at this site: i.e., $p_i(E_i)=p_i(0)+\gamma E_i$, where $p_i(0)$ is the dipole at site i in the isolated dot (i.e., when no field is turned on) and γ is the polarizability. It is straightforward (when summing over all the sites i and recalling that the isolated dot has a non-vanishing G(0) toroidal moment but a null polarization) to prove that this equation results in a P polarization and G toroid moment such as $$P \propto \gamma \Sigma_i E_i \text{ and } [G-G(0)] \propto \gamma \Sigma_i r_i \times E_i, \quad (2)$$

where the $r_i$ vectors locate the i unit cells with respect to the dot center. The first equation implies that applying any homogeneous field, as well as the nonsymmetrical inhomogeneous field of the first embodiment (see FIG. 5A), leads to a nonzero polarization, unlike in the case of the more symmetrical inhomogeneous field of the second setup (for which $\Sigma_i E_i$ is null, see FIG. 5B). The right part of the second equation vanishes for an homogeneous electric field (because $\Sigma_i r_i$ is null for the considered cubic structure), while we numerically find that it is not the case for the inhomogeneous fields considered here. Considering non-linear terms in $E_i$ for $p_i(E_i)$ leads to the same conclusions.

Moreover, the qualitative control of the direction of G by inhomogeneous electric fields is a general feature of 0 D ferroelectrics, since we found it (not presented here) to be independent of the surface termination (we checked that by switching off the parameters related to surface termination) and of the shape of the dot (we confirmed that by investigating spheres, cubes, discs, cylinders, and asymmetrically-cut pyramids). Furthermore, additional calculations for which we allow a 50% screening of the surface-charges—that is a realistic electrical boundary conditions [17], and for which we still have a vortex structure for the isolated dot [54]—also yield such control.

Let us now discuss differences or analogies between magnetic and electrical vortices. First of all, the nearest-neighbor exchange interactions are much stronger than the dipole-dipole interactions in magnetic systems, which results in a magnetized core of the vortex [50, 59] and requires relatively large sizes of the nanodots to have a vortex structure. In contrast, because of the large depolarizing energy, very small ferroelectric dots [53, 54] can have a vortex structure without any polarization. These constitute strong advantages of ferroelectric dots over magnetic dots for increasing memory capabilities [53]—via the control of G of single dots by, e.g., the embodiment of FIG. 5B. (Notice that in this embodiment, the electric vortex produces a local field, which can be put in use for sensing and writing.) Second, the electric toroidal moment G, being a cross product of two vectors, is an axial vector, and, consequently, does not break the space symmetry. It also does not break the time symmetry—unlike the magnetic toroidal moment $T=(2N)^{-1} \Sigma_i r_i \times m_i$, where $m_i$ are the local magnetic dipoles at the N lattice sites, which breaks both the time and space symmetry [57, 44, 60-61]. As a result, our main finding that inhomogeneous electric fields (whose cross product with $r_i$ does not break either time or space symmetry) can control G should imply, by symmetry arguments, that inhomogeneous magnetic fields (whose cross product with $r_i$ breaks time and space symmetry) can switch the direction of T. Such analogy is consistent with the observed interactions of magnetic vortices with magnetic fields in asymmetric structures [62]—and thus exhibiting a similarity with the embodiment shown in FIG. 5A.

In summary, first-principles-based simulations demonstrate that transverse inhomogeneous electric fields can control and switch the direction of the electric toroidal moment. Analysis of our calculations provides an understanding of the effects allowing such control and, in particular, points to the importance of the inhomogeneous-field-induced creation of anti-phase chains.

Controlling and switching the direction of the electric toroidal moment in the ferroelectric nanostructures of the present invention may also include piezoelectric means as described following.

To understand piezoelectricity in a polar system, it is useful to expand the thermodynamic potential Φ, in linear order of external fields and stresses as a sum of four terms, following Ref. [63]. Such decomposition is shown in Table 1 showing the analogy between the d piezoelectric tensor in polar systems and the $d^g$ axial piezotoroidic tensor in materials exhibiting an electric dipole vortex. Φ, P, E, σ, μ, g, and curl E represent the thermodynamic potential, polarization, electric field, stress, strain, toroidal moment and the cross-product Δ×E, respectively. The tensor components are indicated in Voigt or matrix notation. The "eq" superscript is used to indicate the value of the properties at equilibrium, that is before applying a field or a stress. Einstein conventions are used for indicating the summations over j and i in the second and third rows.

TABLE 1

| Polarization | Electric dipole vortex |
|---|---|
| $\Phi = -(P - P^{eq}) E - (\eta - \eta^{eq}) \sigma + E d\sigma + \Phi_0$ | $\Phi = -(g - g^{eq}) (\text{curl } E) - (\eta - \eta^{eq}) \sigma + (\text{curl } E) d^g \sigma + \Phi_0$ |
| $d\Phi/dE = 0 \rightarrow P_i = P^{eq}_i + d_{ij}\sigma_j$ | $d\Phi/d\,\text{curl } E = 0 \rightarrow g_i = g^{eq}_i + d^g_{ij}\sigma_j$ |
| $d\Phi/d\sigma = 0 \rightarrow \eta_j = \eta^{eq}_j + d_{ij}E_i$ | $d\Phi/d\sigma = 0 \rightarrow \eta_j = \eta^{eq}_j + d^g_{ij}(\text{curl } E)_i$ |

The first and second terms correspond to the coupling between the polarization, P, and E applied electric field and to the coupling between the σ applied stress and the η strain, respectively. The third energy involves the d piezoelectric tensor, while the last term, $\Phi_0$ gathers all the energies that are explicitly independent of both E and σ. As indicated in Table 1, minimizing the thermodynamic potential with respect to the field yields the mathematical equality associated with the so-called direct piezoelectric effect [63] (that characterizes the polarization's response to a stress). Similarly, the derivation of Φ with respect to a leads to the converse piezoelectric effect—that represents the change of shape of a material when subject to an applied electric field [63].

As described above, ferroelectric nanoparticles adopt a vortex structure for their electric dipoles, when they are under open-circuit-like electrical boundary conditions. Such vortex annihilates the spontaneous polarization in favor of a toroidal moment, to be denoted by g and which is proportional to a cross product of the $p_i$ dipole moment at site i with the $r_i$ position vector locating this site: $g=(2V)^{-1} \Sigma_i r_i \times p_i$ (Note that, unlike in Ref. [31], the volume of the system, V, is introduced here in similarity to the definition of polarization—that is the dipole moment per unit volume). Because of this finding, it is important to determine the thermodynamic potential for systems exhibiting a toroidal moment rather than a polarization. In particular, one may wonder how g enters such potential, or, equivalently, to which quantity g is linearly coupled to provide a relevant energetic term. The answer to this question can be found from Ref. [64] where the combination of all energetic terms linear in g provides a coupling of −g curl E with curl E denoting the cross-product Δ×E. (Note that, according to electrodynamics, [64] curl E is related to −dB/dt, that is minus the derivative of the magnetic induction with respect to time). We then proceed through analogy to derive the third term of the thermodynamic potential for materials exhibiting an electric dipole vortex. More precisely, a new tensor, to be denoted by $d^g$ and connecting curl E and σ, should exist in those materials, by analogy with the piezoelectric tensor d connecting E and σ in polar systems. As displayed in Table 1, vanishing derivatives of Φ reveals that $d^g$ both characterize the response of the toroidal moment to an applied stress ("direct" effect) and the change of shape when applying an electric field with no vanishing curl ("converse" effect). In other words, $d^g$ represents an original kind of electromechanical coupling that should occur in ferroelectric nanodots. This tensor differs in nature from the so-called polar piezotoroidic tensor introduced earlier for magnetic vortices and that connects the electric current density and strain [60, 65]. $d^g$ also differs in symmetry from this polar piezotoroidic tensor, because the symmetry differences between magnetic and electrical dipoles imply that the toroidal moment in magnetic systems is a polar vector [60] while such moment is an axial vector for electric dipole vortices. Based on these distinctions, we propose to name $d^g$ as the "axial piezotoroidic" tensor. Technically, $d^g$ is an axial third-rank tensor—like the mathematical tensor associated with the so-called electrogyration effect [66]. As a result and for instance, this tensor, in matrix notation, has 4 independent components for systems adopting a 4, 4/m or $\bar{4}$ point group [67]: $d^g_{31}=d^g_{32}$, $d^g_{33}$, $d^g_{15}=d^g_{24}$, $d^g_{14}=d^g_{25}$.

We now want to confirm the existence of this new tensor, as well as determine the sign and magnitude of its components, by performing first-principles-based simulations on stress-free nanoparticles made of $PbZr_{1-x}Ti_xO_3$ (PZT)—which is the material of choice for "traditional" piezoelectric applications—and under open-circuit conditions. In our computations, we use an effective Hamiltonian approach that was originally developed by Zhong, Vanderbilt and Rabe [18] for simple Perovskite bulks, then extended to the study of bulks made of ferroelectric solid solutions [19], and finally further generalized to investigate ferroelectric nanodots made of solid solutions [31, 53, 54]. This latter generalization consists in replacing the three-dimensional dipole-dipole interactions (performed in reciprocal space) by the dipole-dipole interactions (computed in real space) occurring inside the nanodots, and by incorporating the effects of the surfaces on the dipoles and strains [31, 53, 54]. The parameters of this effective Hamiltonian approach are determined from first principles [19]. Moreover, electric dipoles and (homogeneous and inhomogeneous) strains are the degrees of freedom in this technique, and are obtained via Monte Carlo simulations. Practically, 20,000 Monte Carlo sweeps are performed to equilibrate the system, and, then, additional 80,000 sweeps are conducted to obtain the statistical average of the investigated physical properties for a single configuration in which Zr and Ti are randomly arranged in the PZT nanoparticle. Finally we do a configurational averaging over 100 realizations of the studied disordered PZT nanodot.

Here, we are going to take advantage of the fluctuation-dissipation theorem [26, 67, 68] and of the outputs of this first-principles-derived approach (namely the toroidal moment and strain at different Monte Carlo sweeps). Indeed, one can relate the axial toroidal moment to statistical averaging in the Gibbs framework: $g=<g>=\Sigma_\mu g^\mu \exp(-U^\mu/k_B T)/\Sigma_\mu \exp(-U^\mu/k_B T)$, where the index p runs over the different possible states, $k_B$ is the Boltzmann constant and $U=U_0-V_g$ curl $E-V\sigma\eta$ with $U_0$ gathering the terms of the internal energy that are independent of curl E and σ. As analogous to the development of Ref. [26], it is straightforward to prove that taking the derivative of g with respect to a leads to:

$$d^g_{\alpha\beta}=(V/k_B T)(<g_\alpha \eta_\beta>-<g_\alpha><\eta_\beta>) \quad (3)$$

where "< >" denotes the average over the Monte Carlo sweeps. Equation (3) provides an efficient computation of the axial piezotoroidic tensor (that is, without applying any stress or electric field).

FIGS. 8A and 8B display the temperature dependence of the g toroidal moment (resulting from the formation of the electric dipole vortex shown in the inset of FIG. 8C) and of the independent elements of the axial piezotoroidic tensor, respectively, for a cubic nanodot made of $PbZr_{0.4}Ti_{0.6}O_3$, as predicted by the use of our first-principles-based approach and Eq. (3). Practically, the studied dot has 48 Å of lateral size, and is under stress-free and open-circuit electrical boundary conditions. FIG. 8A indicates that g vanishes at high enough temperature, leading to a cubic state. On the other hand and as consistent with Ref. [53], decreasing the temperature below $T_m$=600K generates a toroidal moment aligned along the z-axis (chosen to be parallel to the pseudocubic [001] direction). The PZT nanodot thus acquires a tetragonal symmetry with the 4/m point group, below $T_m$. FIG. 8B reveals that the axial piezotoroidic effect indeed exists, below $T_m$ (Note that the magnitude of the coefficients of the axial piezotoroidic tensor depends on some dot's characteristics (such as its size), and that such tensor also exists in the 3D-periodic arrays of dots embedded in a 3D-matrix that have been studied in Ref. [70].), with the different non-zero coefficients (being those determined by symmetry arguments above) increasing (and nearly diverging) as the temperature is increased towards $T_m$—as similar to piezoelectricity below the Curie temperature in "normal" ferroelectrics [70]. (Interestingly, the microscopic origin of the axial piezotoroidic tensor in nanoparticles is identical to that of the piezoelectric tensor in ferroelectric hulks, namely it is caused by the coupling between local dipoles and strains). In particular, one can see that the largest components are $d^g_{31}=d^g_{32}$ and $d^g_{15}=d^g_{24}$. This implies that devices made of PZT nanodots and aimed at efficiently converting mechanical input to electrical output should either use a stress applied along the x- and/or y-direction and take advantage of the significant change of the toroidal moment along the z-direction, or apply a stress in the xoz plane (respectively, yoz plane) and detect the formation of the toroidal moment along the x (respectively, y) direction—especially close to $T_m$. Note that the $d^g_{33}$ component is rather small, which indicates that a reasonable stress applied along the z-axis is not going to significantly modify the toroidal moment. Finally, $d^g_{14}$ is found to vanish owing to an original symmetry element—namely, that combining the mirror element in the zx plane (and passing through the dot's center) with the simultaneous inversion of all the dipole moments leaves the vortex structure unchanged.

We also perform additional first-principles-based computations, in which a stress is directly applied to the nanoparticle. Small values of stress lead to axial piezotoroidic coefficients (calculated as the ratio between the change in toroidal moment over the stress, see Table 1) identical to those reported in FIG. 8B (and that are computed from Eq. (3), (Note that we numerically confirmed that applying a curl of electric field yields a change in strain (converse effect) that is governed by the same coefficients (within 5%) than the change of toroidal moment under an applied stress (direct effect).)). Moreover, a large enough stress can cause the toroidal moment to change in direction. For instance, applying a tensile uniaxial strain of −2 GPa along the initial (z) direction of the toroidal moment at 10K results in the re-orientation of g from z to x or y axes, with equal probability. In other words, stress is also capable of controlling the vortex's chirality, because of the new kind of electromechanical coupling that exists in ferroelectric nanodots. Such control (that can also occur via inhomogeneous electric field [71]) is also technologically important, but for nanomemory devices [53].

Furthermore, note that the axial piezotoroidic tensor is not the only new tensor that can appear in ferroelectric nanostructures. For instance, our simulations (see FIG. 8C) reveal the existence of the tensor defined as the $X^g = (\epsilon_0)^{-1}(\partial g/\partial \text{curl} E)$, where $\epsilon_0$ is the dielectric permittivity of vacuum. By analogy with the "normal" dielectric susceptibility tensor, we name such new tensor as the electric toroidal susceptibility tensor. We compute it as:

$$X^g_{\alpha\beta} = (V/\epsilon_0 k_B T)(\langle g_\alpha g_\beta \rangle - \langle g_\alpha \rangle \langle g_\beta \rangle) \quad (4)$$

following the use of the fluctuation-dissipation theorem [26, 67, 68]. (Note that such new tensor can be thought as analogous (for ferroelectrics) of the connection between the magnetic toroidal moment and curl of B in magnetic systems [44].) FIG. 8C shows that the elements of the electric toroidal susceptibility tensor peak at $T_m$, that is at the temperature for which the nanoparticle acquires a toroidal moment. Above this temperature, the three diagonal elements of this tensor coincide with each other, as consistent with the cubic symmetry. On the other hand, because of the tetragonal symmetry of the ground state, $X^g_{xx}=X^g_{yy}>X^g_{zz}$, below $T_m$. Such electric toroidal susceptibility tensor may also be put in use to design original nanoscale devices, such as, e.g., switchers.

In summary, we have discovered the existence of two original tensors in ferroelectrics exhibiting a vortex structure for their electrical dipoles, via analytical development and first-principles-based computations on a nanodot made of $PbZr_{0.4}Ti_{0.6}O_3$. The first tensor, that we denoted the axial piezotoroidic tensor, characterizes an original form of electromechanical coupling. More precisely, it connects stress and toroidal moment (direct piezotoroidic effect), as well as strain and curl of electric field (converse piezotoroidic effect). Moreover, combining the fluctuation dissipation theorem with first-principles-based simulations provided an efficient way to compute the components of the axial piezotoroidic tensor, as a function of temperature. We have also found another tensor, named the electric toroidal susceptibility, which links toroidal moment and curl of the electric field. Its non-zero components were also determined as a function of temperature, for our investigated nanodot.

The present invention has been described with reference to certain preferred and alternative embodiments that are intended to be exemplary only and not limiting to the full scope of the present invention as set forth in the appended claims.

REFERENCES

[1] S. O'Brien, L. Brus, and C. B. Murray, J. Am. Chem. Soc. 123, 12085 (2001).
[2] J. J. Urban, W. S. Yun, Q. Gu, and H. Park, J. Am. Chem. Soc. 124, 1186 (2002).
[3] W. S. Yun, J. J. Urban, Q. Gu, and H. Park, Ferroelectric properties of individual barium titanate nanowires investigated by scanned probe microscopy, Nano. Lett. 2, 447-450 (2002).
[4] Y. Luo et al., Appl. Phys. Lett. 83, 440 (2003).
[5] C. H. Ahn et al., Local nonvolatile electronic writing of epitaxial $Pb(Zr_{0.52}Ti_{0.48})O_3/SrRuO_3$ heterostructures, Science 276, 1100-1103 (1997).
[6] T. Tybell, C. H. Ahn, and J.-M. Triscone, Appl. Phys. Lett. 75, 856 (1999).
[7] C. Liu et al., J. Am. Chem. Soc. 123, 4344 (2001).
[8] J. F. Scott and C. A. Paz de Araujo, Ferroelectric memories, Science 246, 1400-1405 1989).
[9] O. Auciello, J. F. Scott, and R. Ramesh, Phys. Today 51, No. 7, 22 (1998).
[10] M. E. Lines and A. M. Glass, Principles and Applications of Ferroelectrics and Related Materials (Clarendon, Oxford, 1979).
[11] K. Uchino, Piezoelectric Actuators and Ultrasonic Motors (Kluwer Academic, Boston, 1996).
[12] R. E. Cohen, Origin of ferroelectricity in perovskite oxides, Nature 358, 136-138 (1992).
[13] S. Li et al., Jpn. J. Appl. Phys., Pt. 1, 36, 5169 (1997).
[14] S. Chattopadhyay et al., Phys. Rev. B 52, 13177 (1995).
[15] K. Ishikawa et al., Jpn. J. Appl. Phys., Pt. 1, 35, 5196 (1996).
[16] T. Maruyama et al., Appl. Phys. Lett. 73, 3524 (1998).

[17] J. Junquera and Ph. Ghosez, Critical thickness for ferroelectricity in perovskite ultrathin films, Nature 422, 506-509 (2003).

[18] W. Zhong, D. Vanderbilt, and K. M. Rabe, Phase transitions in $BaTiO_3$ from first principles, Phys. Rev. Lett. 73, 1861-1864 (1994).

[19] L. Bellaiche, A. Garcia, and D. Vanderbilt, Finite-temperature properties of $Pb(Zr_{1-x}Ti_x)O_3$ alloys from first principles, Phys. Rev. Lett. 84, 5427-5430 (2000).

[20] J. Iniguez and D. Vanderbilt, Phys. Rev. Left. 89, 115503 (2002).

[21] Ph. Ghosez and K. M. Rabe, Microscopic model of ferroelectricity in stress-free $PbTiO_3$ ultrathin films, Appl. Phys. Lett. 76, 2767-2769 (2000).

[22] H. Krakauer, R. Yu, C. Z. Wang, and C. Lasota, Ferroelectrics 206, 133 (1998).

[23] A. M. George, J. Iniguez, and L. Bellaiche, Nature (London) 413, 54 (2001).

[24] J. Padilla and D. Vanderbilt, Phys. Rev. B 56, 1625 (1997).

[25] H. Fu and R. E. Cohen, Nature (London) 403, 281 (2000).

[26] A. Garcia and D. Vanderbilt, Appl. Phys. Lett. 72, 2981 (1998).

[27] L. D. Landau and E. M. Lifshitz, Statistical Physics (Butterworth-Heinemann, Oxford, 2000).

[28] N. D. Mermin and H. Wagner, Absence of ferromagnetism or antiferromagnetism in one-or two-dimensional isotropic Heisenberg models, Phys. Rev. Lett. 17, 1133-1136 (1966).

[29] W. Kanzig, Space charge layer near the surface of a ferroelectric, Phys. Rev. 98, 549-550 (1955).

[30] S.-H. Kim et al., Scaling issues of $Pb(Zr,Ti)O_3$ capacitor stack for high, density FeRAM devices, J. Korean Phys. Soc. 42, S1417-S1419 (2003).

[31] H. Fu and L. Bellaiche, Ferroelectricity in barium titanate quantum dots and wires, Phys. Rev. Lett. 91, 257601 (2003).

[32] B. Meyer and D. Vanderbilt, Ab initio study of $BaTiO_3$ and $PbTiO_3$ surfaces in external electric fields, Phys. Rev. B 63, 205426 (2001).

[33] F. D. Morrison et al., Ferroelectric nanotubes, Rev. Adv. Mater. Sci. 4, 114-122 (2003).

[34] L. Bellaiche, A. Garcia, and D. Vanderbilt, Finite-temperature properties of $Pb(Zr_{1-x}Ti_x)O_3$ alloys from first principles, Phys. Rev. Lett. 52, 5427 (2000).

[35] B. Noheda et al., A monoclinic ferroelectric phase in the $Pb(Zr_{1-x}Ti_x)O_3$ solid solution, Appl. Phys. Lett. 74, 2059-2061 (1999).

[36] I. Grinberg, V. R. Cooper, and A. M. Rappe, Relationship between local structure and phase transitions of disordered solid solution, Nature 419, 909-911 (2002).

[37] P. G. de Gennes and J. Prost, The Physics of Liquid Crystals (Clarendon Press, Oxford, 1993).

[38] S. F. Edwards and P. W. Anderson, Theory of spin glasses, J. Phys. F: Metal Phys. 5, 965-974 (1975).

[39] V. Dubovik et al., Theory of the Curie-Weiss behavior of an aggregated magnetic suspension, J. Magn. Magn. Mater. 150, 105-118 (1995).

[40] N. Sicron et al., Nature of the ferroelectric phase transition in $PbTiO_3$, Phys. Rev. B 50, 13168-13180 (1994).

[41] J. Cardy & J. L. Jacobsen, Critical behavior of random-bond Potts models, Phys. Rev. Lett. 79, 4063-4066 (1997).

[42] I. P. Batra, P. Wurfel & B. D. Silverman, New type of first-order phase transition in ferroelectric thin films. Phys. Rev. Lett. 30, 384-387 (1973).

[43] M. Dawber, P. Chandra, P. B. Littlewood. & J. F. Scott, Depolarization corrections to the coercive field in thin-film ferroelectrics. J. Phys. C 15, L393-L398 (2003).

[44] A. A. Gorbatsevich & Yu. V. Kopaev, Toroidal order in crystals, Ferroelectrics 161, 321-334 (1994).

[45] I. Kornev, I., H. Fu. & L. Bellaiche, Ultrathin films of ferroelectric solid solutions under residual depolarizing field, preprint at (http://arxiv.org/cond-mat/0403484) (2004).

[46] D. D. Fong et al., Ferroelectricity in ultrathin perovskite films, Science 304, 1650-1653 (2004).

[47] B. G. Demczyk, R. S. Rai & G. Thomas, Ferroelectric domain structure of lanthanum-modified lead titanate ceramics, J. Am. Ceram. Soc. 73, 615 (1999).

[48] B. Meyer & D. Vanderbilt, Ab-initio study of ferroelectric domain walls in $PbTiO_3$, Phys. Rev. B 65, 104111 (2002).

[49] I. I. Ivanchik, New type of first-order phase transition in ferroelectric thin films, Sov. Phys. Solid State 3, 2705 (1962).

[50] S. D. Bader, Rev. Mod. Phys. 78, 1 (2006).

[51] M. Dawber, 1. Szafraniak, M, Alexe, and J. F. Scott, J. Phys. Condens. Matter 15, L667 (2003).

[52] S. K. Streiffer, J. A. Eastman, D. D. Fong, C. Thompson, A. Munkholm, M. V. R. Murty, 0. Auciello, O. R. Bai, and G. B. Stephenson, Phys. Rev. Lett. 89, 067601 (2002).

[53] I. Naumov, L. Bellaiche, and H. Fu, Nature (London) 432, 737 (2004).

[54] I. Ponomareva, I. I. Naumov, I. Kornev, Huaxiang Fu, and L. Bellaiche, Phys. Rev. B 72, 140102(R) (2005); I. Ponomareva, I. I. Naumov, and L. Bellaiche, Phys. Rev, B 72, 214118 (2005).

[55] A. Hubert and R. Schafer. Magnetic domains (Springer, New York, 2000), p. 167.

[56] V. M. Dubovik, M. A. Martsenyuk, and N. M. Martsenyuk, J. Magn. Magn. Mater. 145, 211 (1995).

[57] V. M. Dubovik and V. V. Tugushev, Phys. Rep. 187, 145 (1990).

[58] E. Almahmoud, Y. Navtsenya, I. Komev, H. Fu, and L. Bellaiche, Phys. Rev. B 70, 220102(R) (2004).

[59] K. Nakamura, T. Ito, and A. J. Freeman, Phys. Rev. B 68, 180404(R) (2003).

[60] H. Schmid, Ferroelectrics 252, 41 (2001).

[61] V. L. Ginzburg, Phys. Usp. 44, 1037 (2001).

[62] M. Schneider, H. Hoffmann, and J. Zweck, Appl. Phys. Lett. 79, 3113 (2001).

[63] J. F. Nye, Physical Properties of Crystals, Oxford University Press, New York (1957).

[64] V. M. Dubovik, M. A. Martsenyuk, and B. Salia, Phys. Rev. E 61, 7087 (2000).

[65] H. Grimmer, Ferroelectrics 161, 181 (1994).

[66] Yu. I. Sirotin and M. P. Shaskolskaya, The Principles of Crystal Physics, Nauka, Moscow (1979).

[67] A. Garcla and D. Vanderbilt D., in First-Principles Calculations for Ferroelectrics: Fifth Williamsburg Workshop, R. E. Cohen, ed., AIP, Woodbury, N.Y., (1998).

[68] K. M. Rabe and E. Cockayne, in First-Principles Calculations for Ferroeiectrics, ed. by R. E. Cohen, AIP Conference Proceedings 436, American Institute of Physics, Woodbury, N.Y. (1998).

[69] S. Prosandeev and L. Bellaiche, Phys. Rev. Lett. 97, 167601 (2006).

[70] M. E. Caspari and W. J. Merz, Phys. Rev. 80, 1082 (1950).

[71] S. Prosandeev, I. Ponomareva, I. Kornev, I. Naumov, and L. Bellaiche, Phys. Rev. Lett. 96, 237601 (2006).

What is claimed is:

1. A device for storing data, comprising:
a low dimensional nano-scale ferroelectric material having at least one vortex ring of polarization generating an ordered toroid moment switchable between at least two stable states; and means for switching said states with a transverse inhomogeneous static electric field.

2. The device of claim 1, wherein said ferroelectric material comprises a perovskite.

3. The device of claim 2, wherein said perovskite comprises $PbZr_{1-x}Ti_xO_3$, where x is any value from 0 to 1.

4. A device for storing data, comprising:
a low dimensional nano-scale ferroelectric material having at least one vortex ring of polarization generating an ordered toroid moment switchable between at least two stable states; and
means for switching said states by electromechanical coupling to said toroid moment.

5. The device of claim 4, wherein said ferroelectric material comprises a perovskite.

6. The device of claim 5, wherein said perovskite comprises $PbZr_{1-x}Ti_xO_3$, where x is any value from 0 to 1.

* * * * *